United States Patent [19]
Abiko et al.

[11] Patent Number: 5,600,157
[45] Date of Patent: Feb. 4, 1997

[54] LIGHT-EMITTING AND LIGHT-SENSING DIODE ARRAY DEVICE, AND LIGHT-EMITTING AND LIGHT-SENSING DIODE WITH IMPROVED SENSITIVITY

[75] Inventors: Ichimatsu Abiko; Yukio Nakamura; Katsuzo Kaminishi; Takatoku Shimizu; Kazuo Tokura; Yasuo Iguti; Hiroshi Furuya; Mituhiko Ogihara; Masumi Taninaka; Mio Chiba, all of Tokyo, Japan

[73] Assignee: Oki Electric Industry Co., Ltd., Tokyo, Japan

[21] Appl. No.: 654,756

[22] Filed: May 29, 1996

Related U.S. Application Data

[63] Continuation of Ser. No. 234,022, Apr. 28, 1994, abandoned.

[30] Foreign Application Priority Data

| Apr. 28, 1993 | [JP] | Japan | 5-103338 |
| Aug. 25, 1993 | [JP] | Japan | 5-210074 |
| Oct. 6, 1993 | [JP] | Japan | 5-250571 |

[51] Int. Cl.$^6$ .......... H01L 27/15; H01L 31/153; H01L 31/12
[52] U.S. Cl. .......... 257/84; 257/80; 257/101; 257/102; 257/103; 257/463; 257/465
[58] Field of Search .......... 257/80, 82, 84, 257/88, 101, 102, 103, 440, 450, 463, 465

[56] References Cited

U.S. PATENT DOCUMENTS

| 4,037,241 | 7/1977 | Dierschke | 257/102 |
| 4,424,523 | 1/1984 | Snelling et al. | 358/296 |
| 4,424,524 | 1/1984 | Daniels | 347/130 |
| 5,189,496 | 2/1993 | Kuwabara | 257/101 |

FOREIGN PATENT DOCUMENTS

| 160811A | 3/1984 | Germany | 257/101 |
| 58-157252 | 9/1983 | Japan . | |
| 61-13676 | 1/1986 | Japan | 257/80 |

*Primary Examiner*—Mahshid Saadat
*Assistant Examiner*—John Guay
*Attorney, Agent, or Firm*—Spencer & Frank

[57] ABSTRACT

According to a first aspect of the invention, a light-emitting and light-sensing diode has a doped region with a depth not exceeding 2 μm, for adequate sensitivity, and an impurity concentration of at least $5 \times 10^{20}$ atoms/cm$^{-3}$, for adequate emission. According to a second aspect of the invention, a light-emitting and light-sensing diode has a doped region with a deep part and a shallow part, and the area of the shallow part is increased to enhance the sensitivity of the diode. This may be done by providing the doped region with a meandering edge, or with one or more interior islands, or by forming the deep and shallow parts separately.

10 Claims, 35 Drawing Sheets

LIGHT-EMITTING AND LIGHT-SENSING DIODE ARRAY DEVICE, AND LIGHT-EMITTING AND LIGHT-SENSING DIODE WITH IMPROVED SENSITIVITY

This application is a Continuation of application Ser. No. 08/234,022, filed Apr. 28, 1994 (now abandoned).

BACKGROUND OF THE INVENTION

This invention relates to a light-emitting and light-sensing diode array device, a light-emitting and light-sensing diode, and to fabrication methods thereof.

Linear arrays of light-emitting diodes (commonly referred to as LEDs) are used in printers and copiers to form latent electrostatic images by illuminating a photosensitive medium, typically a revolving drum. To function as light emitters, the diodes are forward-biased. If they are reverse-biased, however, the same diodes can function as light sensors for use in scanning documents. This offers an economical way to build a device that can operate in various modes: for example, as a printer, scanner, copier, and facsimile machine. Examples of such devices can be found in the prior art.

The present invention addresses two problems that occur when an array of LEDs is also used for light sensing. The first problem is that the sensitivity is low. The second problem, which can also occur in arrays of purely light-sensing diodes, is that the sensitivity is non-uniform.

SUMMARY OF THE INVENTION

It is accordingly an object of the present invention to increase the sensitivity of light-emitting and light-sensing diodes.

Another object of the invention is to provide an array of light-sensing diodes with uniform sensitivity.

According to a first aspect of the invention, a diode for emitting and sensing light is formed by introducing a p-type impurity into an n-type gallium-arsenide-phosphide substrate to form a pn junction at a depth of at least 0.3 micrometers (μm), but not more than 2 μm. The p-type impurity concentration is at least $5 \times 10^{20}$ atoms per cubic centimeter but does not exceed $10^{23}$ atoms per cubic centimeter.

According to a second aspect of the invention, a diode for emitting and sensing light comprises a doped region formed by introducing an impurity of one conductive type into a semiconductor substrate of another conductive type, creating a pn junction at an interface between the doped region and substrate. The doped region has a deep part in which the pn junction has a first depth, and a shallow part in which the pn junction has a second depth less than the first depth. To obtain adequate sensitivity, the invention provides several methods of increasing the area of the shallow part.

If the doped region is formed by thermal diffusion of the impurity, a narrow shallow part is created naturally by lateral diffusion around the edges of the doped region. To increase the area of the shallow part, the invention increases the edge length by means of meanders, or by providing one or more non-doped islands within the doped region.

An alternative method is to form the deep and shallow parts by introducing impurities to different depths in two separate steps. Another alternative method introduces impurities in a single step, with the shallow part covered by a shelf of material that reduces the pn junction depth. Yet another method introduces impurities in a single step to the depth of the deep part, then partially etches the doped region to form the shallow part.

DETAILED DESCRIPTION OF THE PREFERRED EMBODIMENTS

The invention will be better understood with reference to the attached drawings. First a general description of an array of light-emitting and light-sensing diodes will be given with reference to FIGS 1–5; next the problems of low and non-uniform sensitivity will be analyzed in greater detail with reference to FIGS. 6–8; and finally, the solutions offered by the present invention will be described through a series of illustrative embodiments. These embodiments do not limit the scope of the invention, which should be determined solely from the appended claims.

Figure 1:
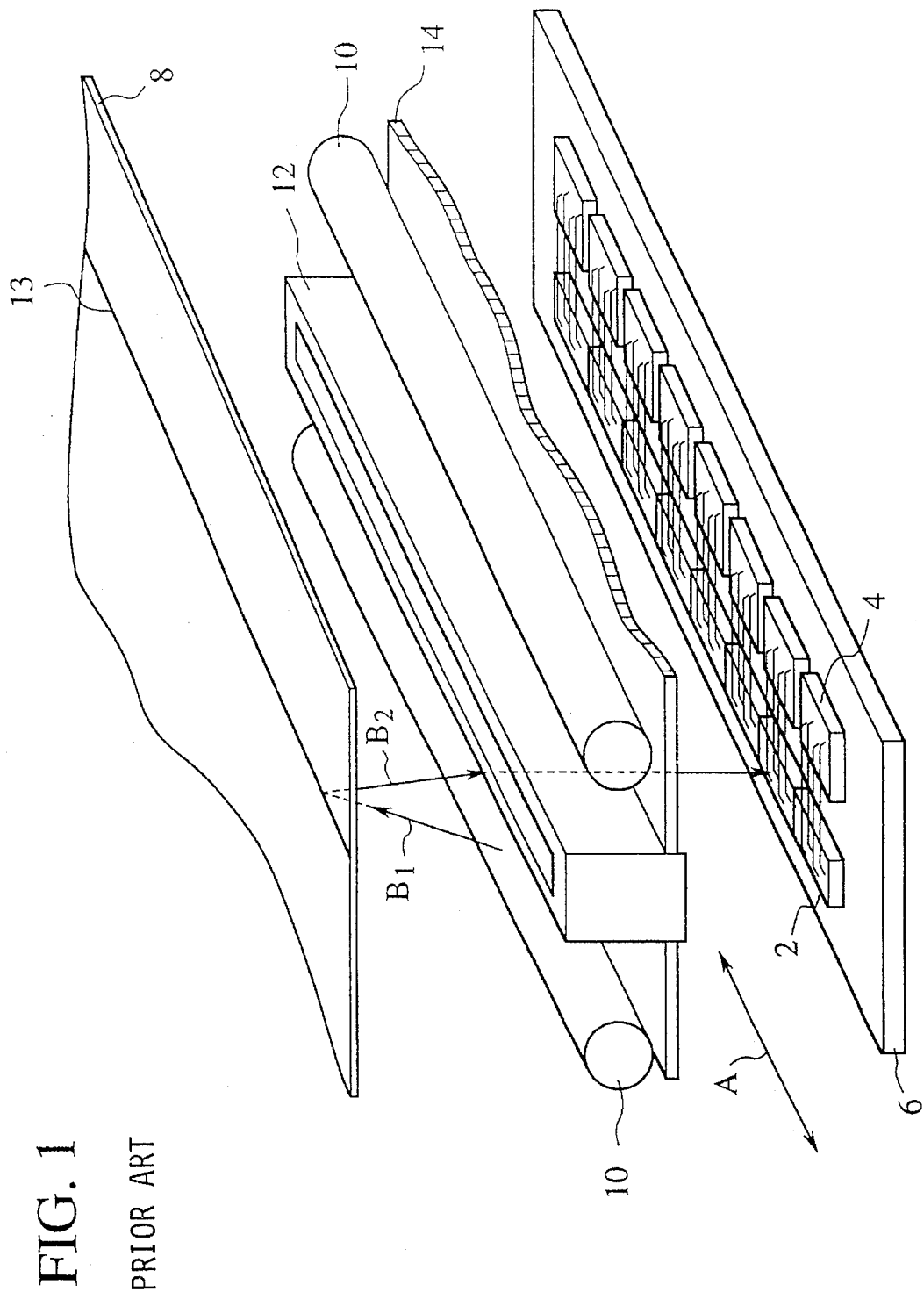
FIG. 1 illustrates a light-emitting and light-sensing diode array operating in a light-sensing mode.

Referring to FIG. 1, an array 2 of light-emitting and light-sensing diodes is mounted, together with a driver array 4, on a printed wiring board 6. The diode array 2 is a linear array of LEDs disposed side-by-side in the direction of arrow A, as will be illustrated later. The diode array 2 and driver array 4 are interconnected by a plurality of wires 7 made of gold or another suitable metal. The diode array 2 normally comprises a plurality of monolithic semiconductor chips (eight chips in the drawing) placed end-to-end.

When the diode array 2 operates in its light-sensing mode, it is brought to a position beneath a document 8 resting on, for example, a transparent glass plate not shown in the drawing. The document 8 is illuminated from below by a pair of lamps 10, and light reflected from the document is focused by a lens array 12 onto the diode array 2, as indicated by arrows $B_1$ and $B_2$. The diode array 2 thus scans one line 13 all at once on the document 8. A shield 14 prevents light from the lamps 10 from reaching the diode array 2 directly. The diode array 2 and document 8 can be moved relative to one another in a direction perpendicular to arrow A to scan the entire document, one line at a time.

When the diode array 2 operates in its light-emitting mode, it is moved to another position adjacent, for example, a rotating photosensitive drum, which it illuminates to form a printable image. Since the present invention is concerned with problems arising in the light-sensing mode, a detailed description of the light-emitting mode will be omitted.

Figure 2:
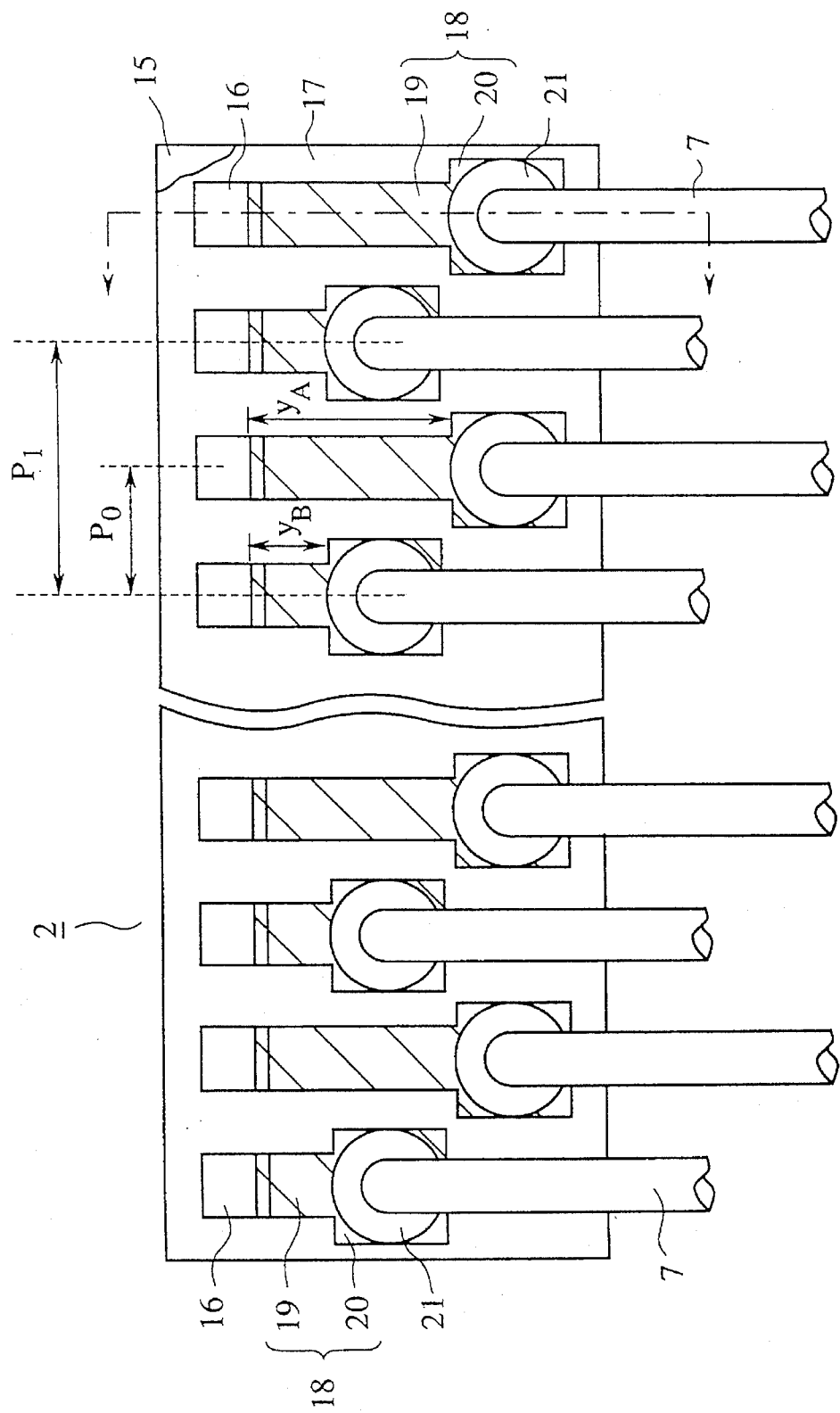
FIG. 2 is an enlarged plan view of part of the array FIG. 1.

FIG. 2 shows an enlarged plan view of the diode array 2. The diodes are formed in, for example, an n-type gallium-arsenide-phosphide (GaAsP) semiconductor substrate 15 which is selectively doped with a p-type impurity such as zinc. This doping creates a plurality of diodes 16, each of which functions as a single light-emitting and light-sensing element. The area surrounding the diodes 16 is covered by a transparent insulating film 17 comprising, for example, an oxide, nitride, or nitroxide of silicon. The insulating film 17 may be a single-layer film or a multiple-layer film, e.g. a film having a silicon nitride layer and a silicon nitroxide layer. In the drawing, the insulating film 17 covers the entire semiconductor substrate 15 except for a window above each diode 16.

Conductive patterns 18 are formed on the insulating film 17, one pattern for each diode. The conductive patterns 18 may be made of aluminum or other suitable conductive materials. Each conductive pattern 18 comprises a narrow lead 19 which makes contact with the doped region of the diode 16, and a wider bonding pad 20. The spacing $P_0$ between adjacent diodes 16 is too small for the bonding pads 20 to be disposed side-by-side, so they are disposed in a staggered arrangement. This allows a spacing $P_1$ equal to twice $P_0$ between adjacent bonding pads 20, so that the flattened ends 21 of the bonded wires 7 do not make mutual contact with one another. A further consequence of the staggered arrangement is that the leads 19 of, for example, even-numbered diodes are longer than the leads 19 of odd-numbered diodes (in the drawing, $y_A > y_B$).

In a device with a resolution of three hundred dots per inch, $P_0$ is approximately 84.6 µm, and $P_1$ is 169.2 µm. The finest pitch feasible with present wire-bonding technology is about 100 µm, so the need to stagger the bonding pads 20 is obvious.

Figure 3:
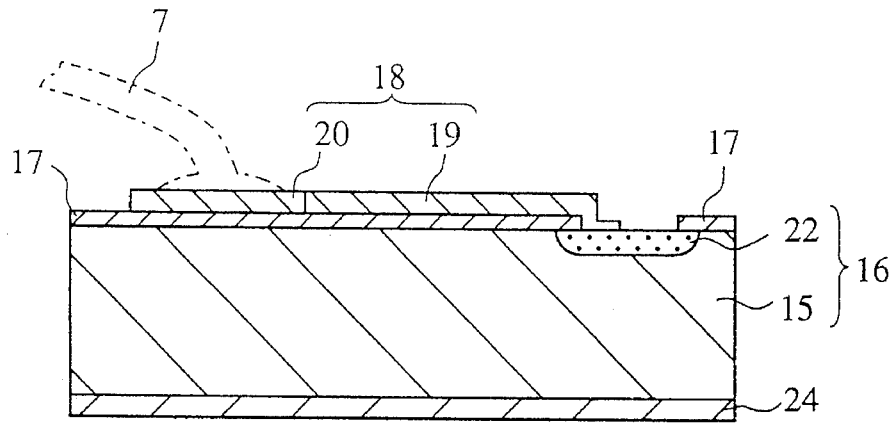
FIG. 3 is a sectional view of one diode.

FIG. 3 is a sectional view along the line indicated by the dot-dash arrow in FIG. 2, showing the structure of one diode. The same reference numerals are used as in FIG. 2 to identify the semiconductor substrate 15, diode 16, insulating film 17, and conductive pattern 18 with its lead 19 and bonding pad 20. The doped region 22 is formed by thermal diffusion of zinc through a window in the insulating film 17. The diode 16 comprises the doped region 22 and adjacent portions of the semiconductor substrate 15. A pn junction is formed at the interface between the doped region 22 and semiconductor substrate 15. A metalized film 24 deposited oil the bottom of the semiconductor substrate 15 provides a common electrode for all the LEDs.

Figure 4:
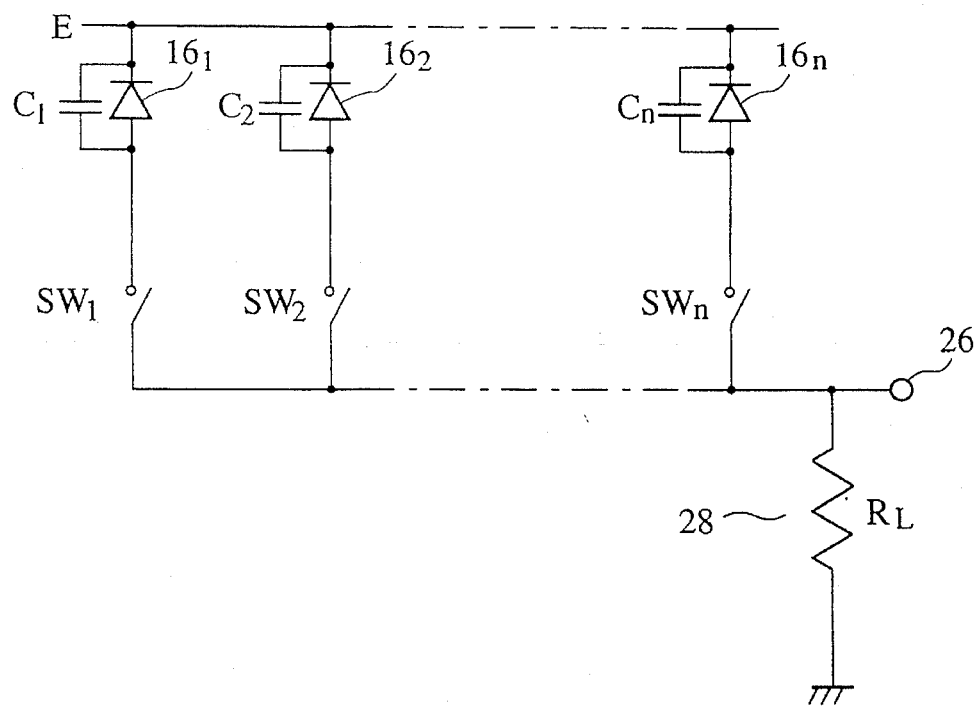
FIG. 4 is a schematic diagram of the diode array illustrating the light-sensing mode of operation.

FIG. 4 is a schematic diagram of the electrical connections of the diode array in light-sensing mode, subscripts from 1 to n being used to identify different diodes 16. A positive voltage E is applied through the metalized film 24 in FIG. 3 to the n-type substrate material of all of the diodes 16. The doped regions 22 of the diodes 16 are coupled through individual switches $SW_1 \ldots SW_n$ to an output terminal 26 and resistor 28, and through resistor 28 to ground.

Next the light-sensing operation will be described and the problem of non-uniform sensitivity analyzed. Light-sensing can be performed in two ways: by direct reading of photocurrents, or by charge storage in the pn junctions. FIG. 4 is designed for the charge storage method, so this method will be described below.

Referring again to FIG. 4, the n diodes 16 in the array have associated capacitances $C_1, \ldots C_n$, which consist partly of the capacitance of the pn junction and partly of a parasitic capacitance formed by the conductive pattern 18, insulating film 17, and semiconductor substrate 15. When, for example, switch $SW_1$ is closed, current flows from the first diode $16_1$ through the resistor 28 to ground. Part of the current consists of photocurrent $I_L$ flowing through the diode $16_1$. The rest is charging current $I_C$ that charges capacitance $C_1$. When switch $SW_1$ is open, capacitance $C_1$ discharges by flow of photocurrent $I_L$ through the diode $16_1$.

Figure 5:
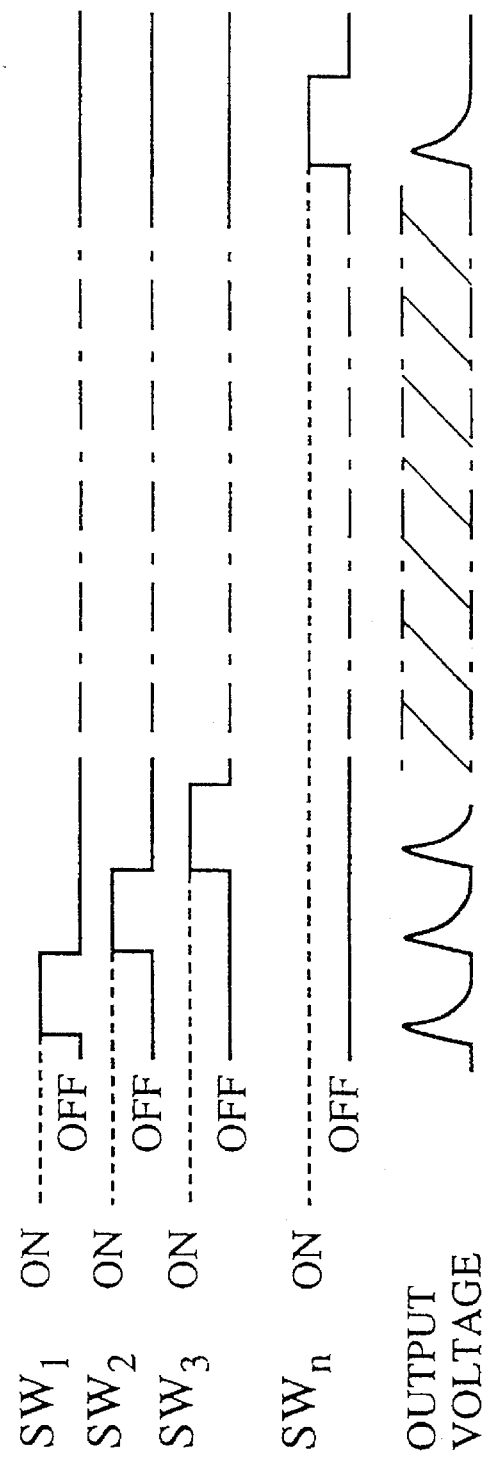
FIG. 5 is a timing diagram illustrating the reading of the diode array.

Referring to FIG. 5, to scan one line, the switches $SW_1$ to $SW_n$ are closed and opened in turn. When switch $SW_1$ is closed at the beginning of the scan, the capacitance $C_1$ of the first diode begins charging toward the ground potential supplied to its conductive pattern 18. While $C_1$ is charging, the voltage at the output terminal 26 can be expressed as:

$$(I_L+I_C) \times R_L$$

$I_L$ is substantially constant, but $I_C$ decreases exponentially as charging progresses. By the time switch $SW_1$ is opened, the conductive pattern 18 and doped region 22 of the first diode $16_1$ have reached ground potential and $I_C$ has been reduced to substantially zero, leaving only the relatively small photocurrent $I_L$. Accordingly, the output voltage during the interval in which $SW_1$ is closed has a waveform like that shown in FIG. 5, first rising to a level to be described below, then declining exponentially to a level near ground level.

Next, when switch $SW_2$ is closed, a similar voltage waveform is output for the second diode $16_2$. This process is repeated to read the voltage output by each diode.

During the interval while $SW_1$ is open, the conductive pattern 18 and doped region 22 of diode $16_1$ discharge from ground level toward the potential E of the substrate 15, by flow of photocurrent $I_L$ across the pn junction. If t is the duration of this interval and $R_1$ is the resistance of the diode $16_1$, then by the beginning of the next scan the conductive pattern 18 and doped region 22 reach a voltage of:

$$V = E \times \{1 - exp[-t/(R_1 C_1)]\} \quad (1)$$

Resistance $R_1$ is inversely proportional to the photocurrent $I_L$:

$$R_1 = E/I_L \quad (2)$$

If A is the photoreceptive area of the diode $16_1$, η is its photosensitivity coefficient, and L is the intensity of the incident light, then the photocurrent $I_L$ is:

When switch $SW_1$ is closed again at the beginning of the next scan, the voltage at the output terminal 26 quickly rises to approximately the voltage V given by the above equation (1), which becomes the output voltage produced by diode $16_1$. The output voltage thus depends on the amount of illumination received by diode $16_1$ since the last time $SW_1$ was turned on, which is as desired.

Next the problem of low sensitivity will be described.

In light-emitting mode, the diode array 2 must form images by illuminating a photosensitive drum, so it is conventionally designed to emit light at the wavelength of maximum spectral response of the photosensitive drum material. The peak emission wavelength can be adjusted by varying the substrate composition of the diode array 2. For a 740-nanometer (nm) emission wavelength, for example, the semiconductor substrate 15 of the diode array 2 should have a composition of $GaAs_{0.8}P_{0.2}$.

Figure 6:
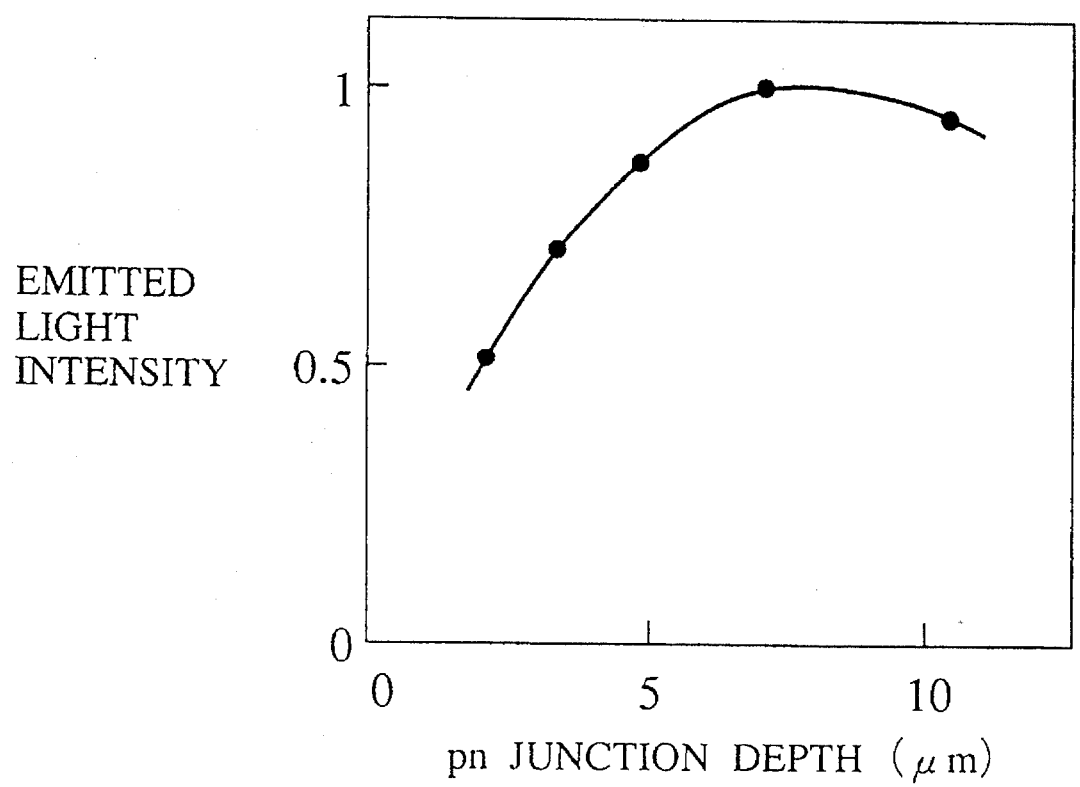
FIG. 6 is graph of emitted light intensity as a function of junction depth.

FIG. 6 depicts the relation between emitted light intensity, shown on the vertical axis, and pn junction depth, shown on the horizontal axis, for a diode with a $GaAs_{0.8}P_{0.2}$ substrate. Maximum intensity is obtained when the junction depth is about 7.5 μm. The shape of the curve in FIG. 6 can be explained as follows.

Light is emitted from the depletion zone adjacent the pn junction of the diode. If the junction depth is too great, light output is reduced by absorption in the body of the diode before the light can reach the surface. If the junction is too shallow, however, the depletion zone is located near the surface of the doped region 22, where the concentration of impurities and crystal defects is relatively high, and these factors reduce the amount of light emitted. Specifically, they result in increased occupation of energy levels in the depletion zone, hence in less opportunity for light to be emitted by transitions from higher to lower energy levels.

In general, the diode array 2 is designed for an emission peak in the wavelength range from about 660 to 780 nm, in which the materials generally used pn photosensitive drums have an adequate spectral response. The junction depth is typically in the range from 5 μm to 10 μm.

Light is also sensed in the depletion zone adjacent the pn junction. For scanning documents, the diode array 2 must sense visible light, including light with wavelengths somewhat shorter than the above range. This creates a problem because shorter wavelengths are more strongly absorbed by the GaAsP material of the diode.

Figure 7:
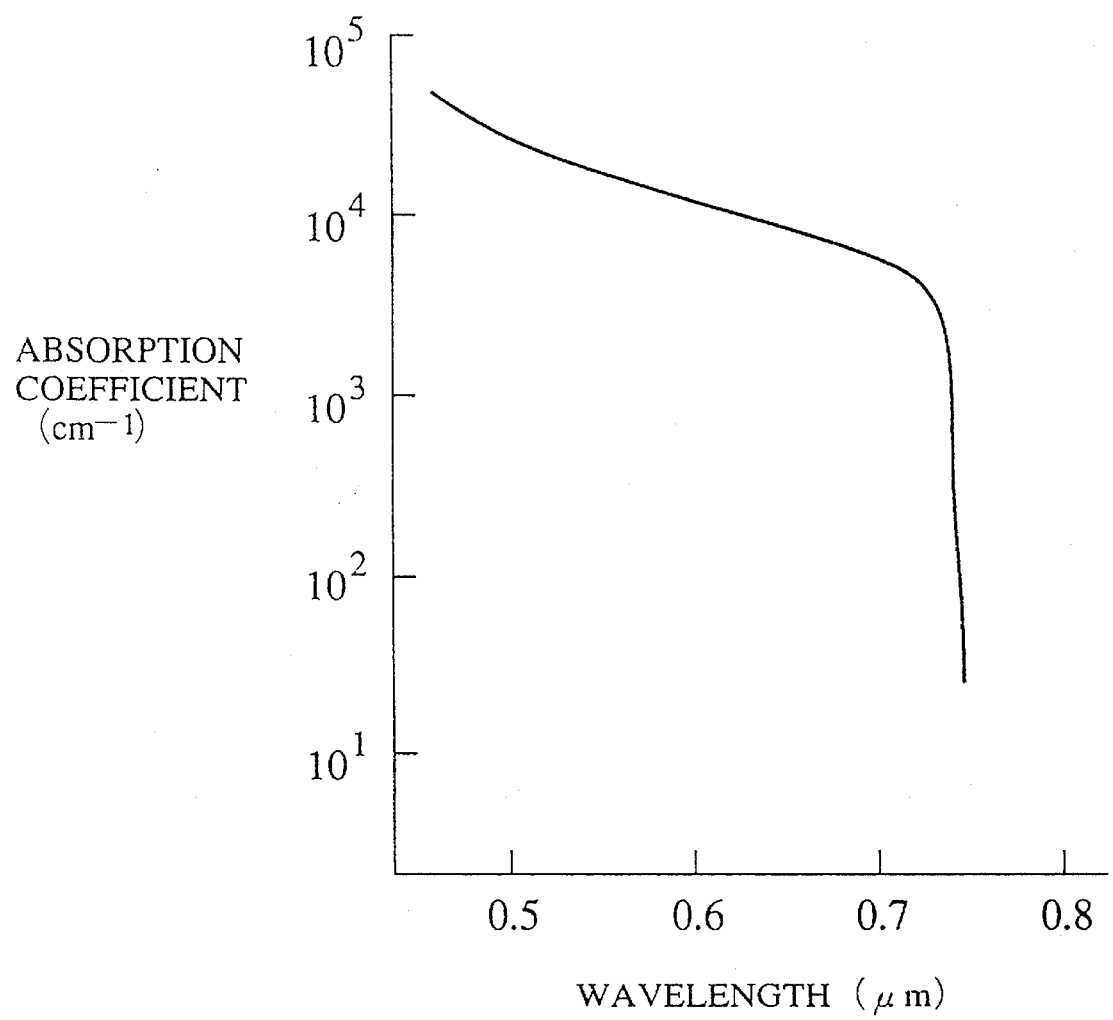
FIG. 7 is a graph illustrating the wavelength dependency of the light absorption coefficient of $GaAs_{0.8}P_{0.2}$.

FIG. 7 shows the wavelength dependency of the absorption coefficient for $GaAs_{0.8}P_{0.2}$. Wavelength in nanometers (nm) is shown on the horizontal axis, and the absorption coefficient (per centimeter) is shown on a logarithmic scale on the vertical axis. The absorption coefficient can be used to calculate the penetration distance x at which incoming light intensity is reduced to about 37% (more precisely, to 1/e, where e is the natural logarithm base) as compared to the intensity at the surface.

For wavelengths in the vicinity of 550 nm, which is near the middle of the visible spectrum and corresponds to the color green, $GaAs_{0.8}P_{0.2}$ has an absorption coefficient in the range from $1 \times 10^4$ to $3 \times 10^4$ cm$^1$ and the above distance x works out to be about 0.3 to 0.7 μm. For wavelengths near 740 nm, which is at the extreme red end of the visible spectrum (actually in the near infrared region), the absorption coefficient of $GaAs_{0.8}P_{0.2}$ is about $1 \times 10^3$ to $2 \times 10^3$ and the above distance x is about 5 to 10 μm.

It follows that for a diode fabricated from $GaAs_{0.8}P_{0.2}$ with a junction depth of 5 to 10 μm, although emitted light (with a wavelength of 740 nm) is not strongly absorbed, incident visible light is very strongly absorbed. Practically none of the incident light actually reaches the pn junction. Effective photoelectric conversion can take place only around the edges of the diode, where the pn junction rises closer to the surface of the diode.

Figure 8:
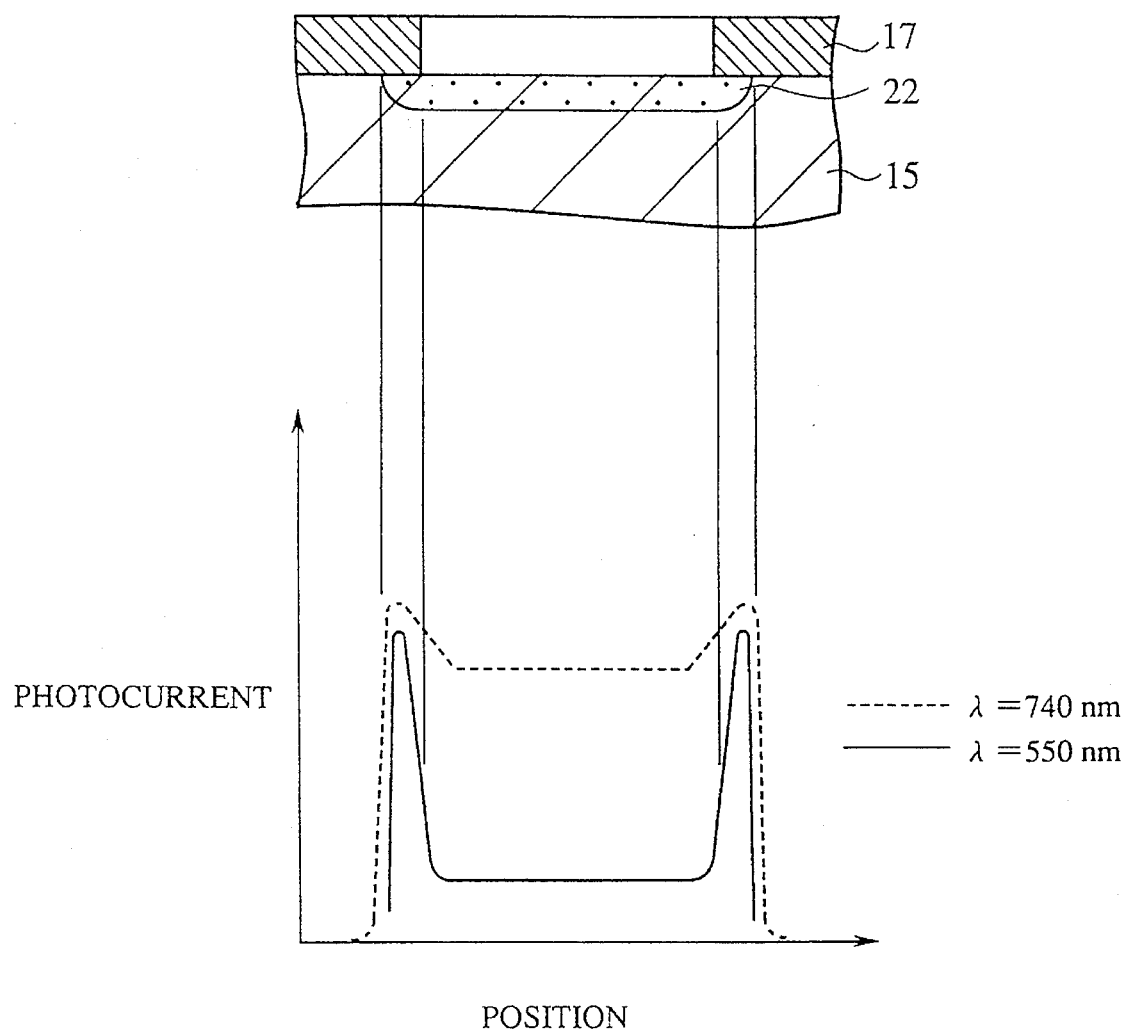
FIG. 8 illustrates the results of photocurrent measurements when a diode is illuminated at two different wavelengths.

If the photosensitivity characteristic of a light-emitting diode used as a photo-sensing element is investigated experimentally, results like those shown in FIG. 8 are obtained. At the top of FIG. 8 the diode is shown in sectional view (viewed end-on instead of from the side as in FIG. 3). The conductive pattern 18 is omitted from FIG. 8 for the sake of clarity. At the bottom of FIG. 8 is shown a graph plotting photocurrent when the diode is illuminated by light through a slit, as a function of the position of the slit. The solid curve is for light, with a wavelength of 550 nm. The dashed curve is for light with a wavelength of 740 nm. The experiment was performed by scanning the slit across the diode in the right-left direction in the drawing.

As call be seen from FIG. 8, when the diode was scanned using light with a wavelength of 550 nm, typical of the light reflected from a document, photoelectric conversion was mainly confined to the edges of the diode, where the pn junction was relatively shallow. At the near-infrared wavelength of 740 nm, substantial photocurrent was measured over the entire width of the diode, but of course documents are not normally scanned with infrared light.

The low sensitivity of conventional LEDs when used as light sensors is easily explained from FIG. 8. In visible light-sensing mode, a conventional LED is sensitive only to light received in a restricted area around its edges.

Now the problem of non-uniform sensitivity is analyzed.

As was mentioned above, the conductive patterns are disposed in a staggered arrangement, and as a result, the leads 19 of, for example, even-numbered diodes are longer than the leads 19 of odd-numbered diodes (in the drawing, $y_A > y_B$).

As explained with reference to equations (1) to (3), the output voltage of the diodes depends on the amount of illumination received by diodes, e.g., $16_1$. The output voltage also depends, however, oil other parameters in the equations (1) to (3), such as u, A, and the capacitance $C_1$, which tend to vary from one diode in the array to another. In particular, there is a large difference between the capacitances $C_1$, $C_3$ . . . of odd-numbered diodes and the capacitances $C_2$, $C_4$ . . . of even-numbered diodes. Referring again to FIG. 2, the reason for this difference is the different lengths $y_A$ and $y_B$ of the leads 19 of even- and odd-numbered diodes. The parasitic capacitance created by the conductive pattern 18, insulating film 17, and semiconductor substrate 15 is proportional to the area of the conductive pattern 18, so this capacitance is relatively large for even-numbered diodes, which have longer leads 19, and relatively small for odd-numbered diodes which have shorter leads 19.

Another parameter that tends to vary from diode to diode is the photoreceptive area A of the diode. Differences in area A can arise from such factors as mask alignment error in the process that forms the diode. These differences affect the photocurrent $I_L$ directly, and also affect the pn junction capacitance of the diode, thus affecting all parameters that determine the output voltage.

The result of these differences is that even when all diodes are illuminated at a uniform light level, they produce non-uniform output voltages. Thus when a document 8 is scanned, the scanned image appears to be degraded by noise.

Next embodiments of the invention that solve the above problems of low sensitivity will be described.

Figure 9:
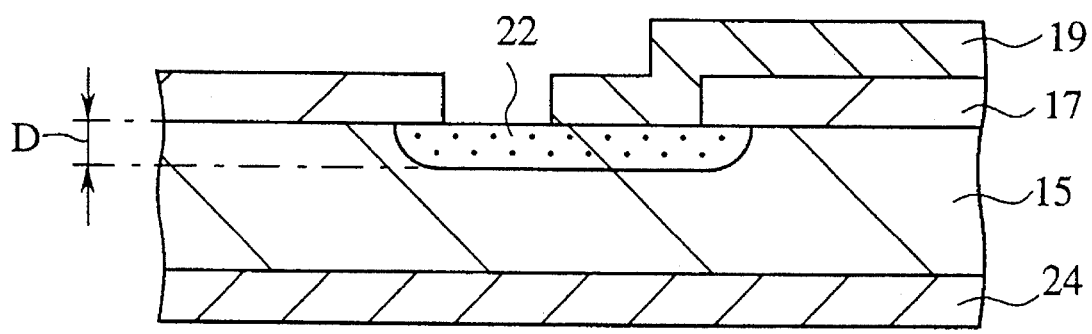
FIG. 9 is a sectional view of a diode in a first embodiment of the invention.

FIG. 9 is a sectional view of a light-emitting and light-sensing diode illustrating a first embodiment of the invention. The same reference numerals are used as in FIG. 3 to identify the semiconductor substrate 15, insulating film 17, lead 19, doped region 22, and metalized film 24. A novel feature of this embodiment is that the doped region 22 has a substantially uniform depth D of not more than 2 μm; accordingly, the pn junction depth does not exceed 2 μm. Incidentally, FIG. 9 is not drawn to scale; the sizes of all parts other than the semiconductor substrate 15 are exaggerated for clarity.

The semiconductor substrate 15 in this embodiment comprises n-type $GaAs_{0.8}P_{0.2}$, for emission at 740 nm as described above. The insulating film 17 comprises aluminum oxide ($Al_2O_3$). The lead 19 comprises aluminum. The doped region 22 is doped with a p-type impurity such as zinc, with an impurity concentration of at least $5 \times 10^{20}$ atoms per cubic centimeter. The doping concentration is another novel feature of this embodiment. The metalized film 24 comprises an alloy of gold, german lure, and nickel.

Reducing the pn junction depth to 2 μm or less reduces absorption of visible light, thereby increasing the sensitivity of the diode in light-sensing mode. Since the thickness of the doped region 22 is uniformly 2 μm or less, the diode can sense light over its entire area, instead of just at the edges. Increasing the doping concentration to $5 \times 10^{20}$ atoms/cm$^3$ or more provides adequate emission intensity despite the reduced pn junction depth.

Next the steps in a process for fabricating the diode of the first embodiment will be described. Although only the fabrication of a single diode will be described, the process can obviously be used to fabricate an array of light-emitting and light-sensing diodes.

Figure 10:
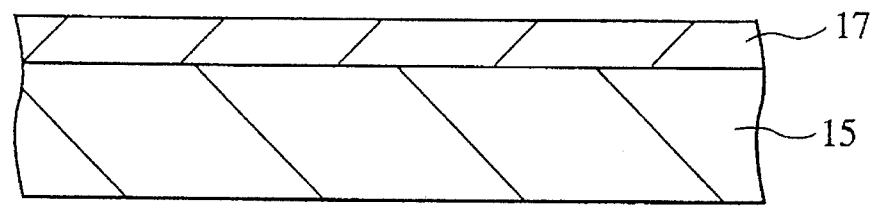
FIG. 10 illustrates a first step in the fabrication of the first embodiment.

Referring to FIG. 10, the process starts from a semiconductor substrate 15 of n-type $GaAs_{0.8}P_{0.2}$. Well-known thin-film formation techniques such as sputtering are used to deposit a film of $Al_2O_3$ on the substrate 15, thereby forming the insulating film 17. The material and thickness of the insulating film 17 must be selected so as to block passage of the impurity that will be diffused to form the p-type region of the diode.

Figure 11:
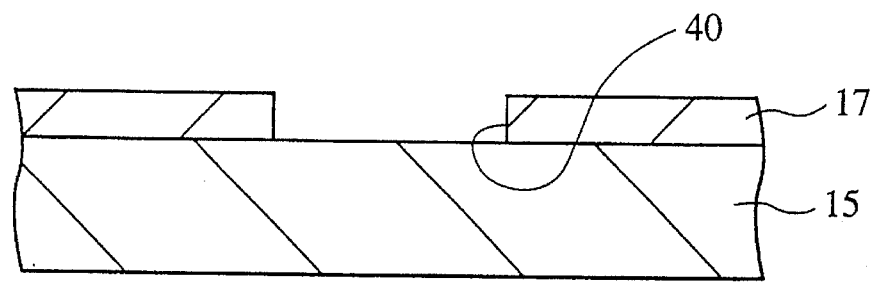
FIG. 11 illustrates a second step in the fabrication the first embodiment.

Referring to FIG. 11, next well-known photolithography and etching techniques are used to remove, part of insulating film 17, creating a window 40. The window 40 exposes the semiconductor substrate 15 in the area where the p-type doped region will be formed. The insulating film 17 will be used as a diffusion mask.

Figure 12:
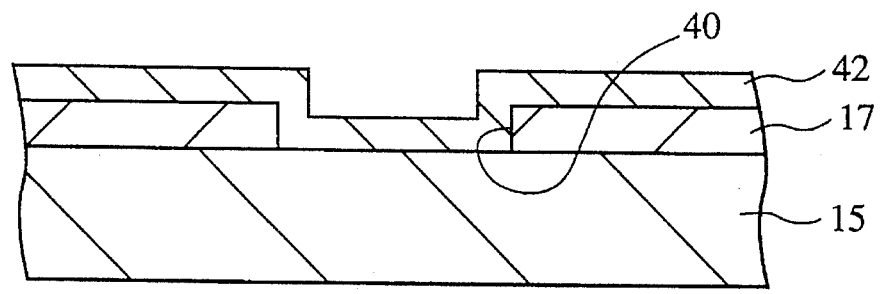
FIG. 12 illustrates a third step in the fabrication of the first embodiment.

Referring to FIG. 12, next a thin-film formation technique such as chemical vapor deposition (CVD) is used to create a diffusion control film 42 on the insulating film and exposed semiconductor substrate 15. The diffusion control film 42 comprises, for example, silicon nitride. The selection of the material and thickness of the diffusion control film 42 controls the amount of impurity that will reach the semiconductor substrate 15.

Figure 13:
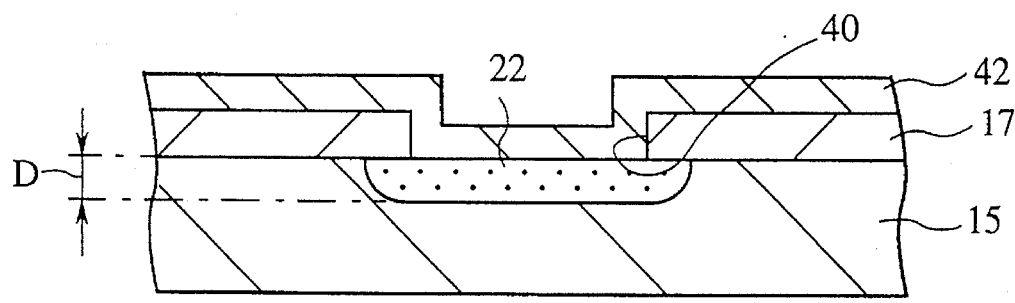
FIG. 13 illustrates a fourth step in the fabrication the first embodiment.

Referring to FIG. 13, the impurity material (zinc in the present case) is now diffused onto the diffusion control film 42. The impurity penetrates the diffusion control film 42 but not the insulating film 17. It then diffuses thermally into the semiconductor substrate 15 to form a doped region 22 which is confined substantially to the area under the window 40 and has a substantially constant thickness D.

The diffusion step is carried out by heating the semiconductor substrate 15 in an atmosphere of zinc vapor. The selection of the heating temperature density of the zinc vapor, and material and thickness of the diffusion control film 42 determines the depth D of the diffusion. The depth D should be controlled to obtain a substantially constant value not exceeding 2 μm. The concentration of impurities in the doped region 22 is controlled by the zinc vapor density and the thickness and material of the diffusion control film 42. The impurity concentration should be controlled to obtain a value such as $10^{21}$ cm$^{-3}$, within the range from $5\times 10^{20}$ cm$^{-3}$ to $10^{23}$ cm$^{-3}$.

Instead of using thermal diffusion, this step can also be carried out by another suitable process such as ion implantation.

Figure 14:
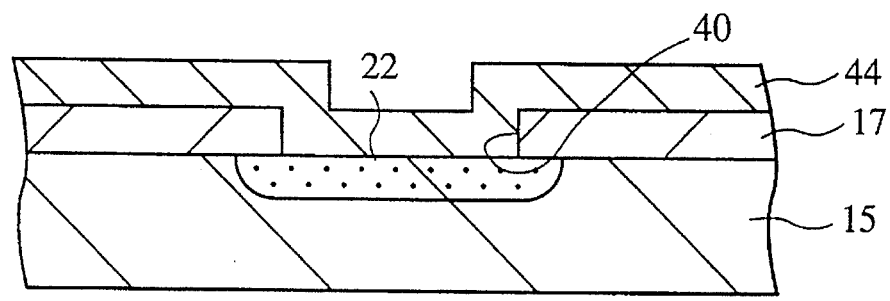
FIG. 14 illustrates a fifth step in the fabrication of the first embodiment.

Referring to FIG. 14, next the diffusion control film 42 is selectively removed by etching, exposing the insulating film 17. Wet etching by hydrofluoric acid, for example, can be employed. Then an aluminum film 44 is deposited on the insulating film 17 and window 40, by sputtering for example.

Figure 15:
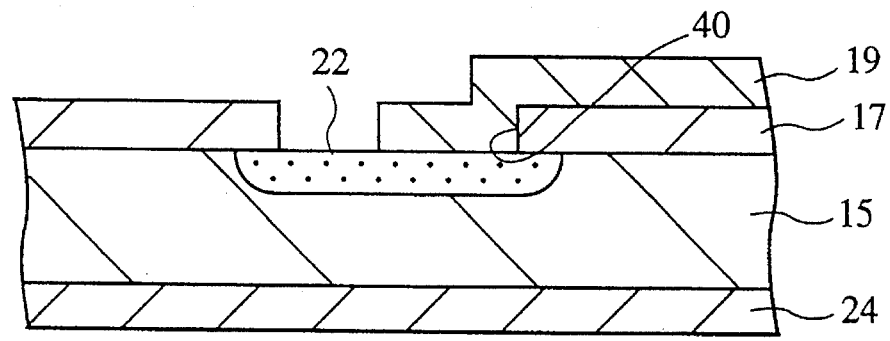
FIG. 15 illustrates a sixth step in the fabrication of the first embodiment.

Referring to FIG. 15, next the aluminum film 44 is patterned by photolithography and etching to form a conductive pattern, including the lead 19 that makes contact with the doped region 22. After the conductive pattern has been formed, the metalized film 24 is deposited on the bottom surface of the semiconductor substrate 15, completing the diode.

The above process was used by the inventors to fabricate a variety of diodes with the conventional zinc impurity concentration of $10^{19}$ to $10^{20}$ atoms/cm$^3$. The thickness D of the doped region 22 was controlled to values of 0.5 µm, 1 µm, 2 µm, and 5 µm. When the photosensitivity of these diodes was measured, for diodes with a thickness D of 0.5 µm, no photocurrent could be measured at all; the diffusion was too shallow for a pn junction to be formed. The reason was that the present state of the diffusion art makes it extremely difficult to dope a region with a thickness of 0.5 µm or less. Among the other thickness values, best sensitivity was obtained with D=1 µm. When the thickness was increased to 2 µm, sensitivity was reduced to about ⅔ the value at 1 µm, but this sensitivity was still satisfactory for practical use. When the thickness was increased to 5 µm, however, sensitivity became unsatisfactory. From these experiments it was determined that satisfactory sensitivity was obtainable with thickness values D of up to 2 µm.

Figure 16:
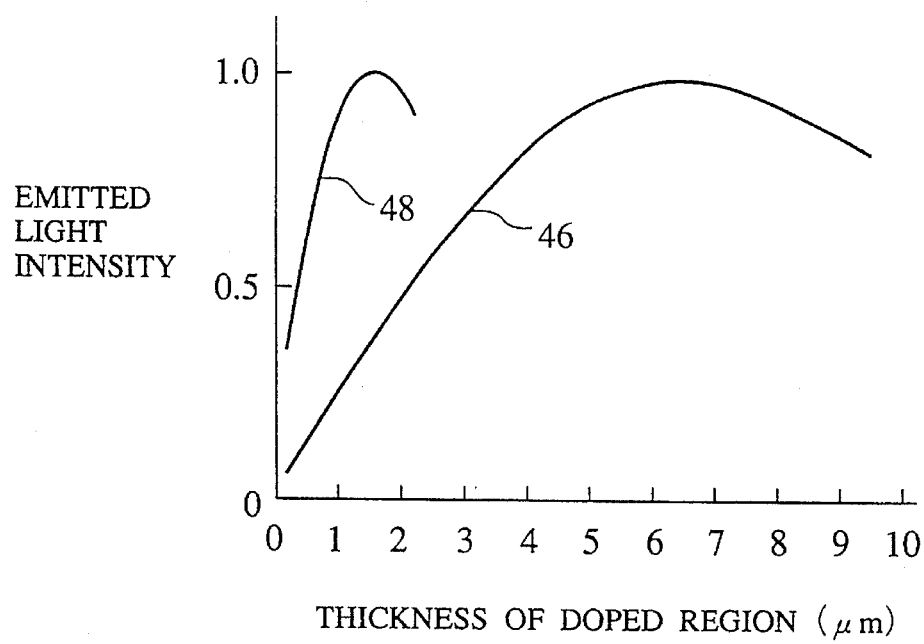
FIG. 16 is a graph of emission intensity curves as a function of junction depth, for two impurity concentrations.

Additional experiments were done to test the light-emitting properties of diodes formed under various conditions. Some of the results are depicted in FIG. 16, which shows emitted light intensity on the vertical axis and thickness of the p-type doped region, equal to the pn junction depth, on the horizontal axis.

Curve 46, which is substantially the curve shown in FIG. 6, was obtained from diodes fabricated with a zinc impurity concentration of $10^{20}$ cm$^3$. The maximum intensity of emitted light occurred at a pn junction depth of about 6 to 8 µm. The curve is shown on a normalized scale with the maximum intensity set equal to unity.

Curve 48 was obtained from diodes with a zinc impurity concentration of $10^{21}$ cm$^3$. This curve is also shown normalized so that its maximum value is equal to unity. With this impurity concentration, maximum emission occurred when the pn junction depth was between 1 µm and 2 µm. Although the actual maximum emitted intensity value was not as high as on curve 46, it was still adequate for forming electrostatic images on a photosensitive drum.

From these experiments it was concluded that by reducing the pn junction depth and increasing the impurity concentration, it was possible to fabricate a diode array that would show both satisfactory photoemission and satisfactory photosensitivity performance.

Figure 17:
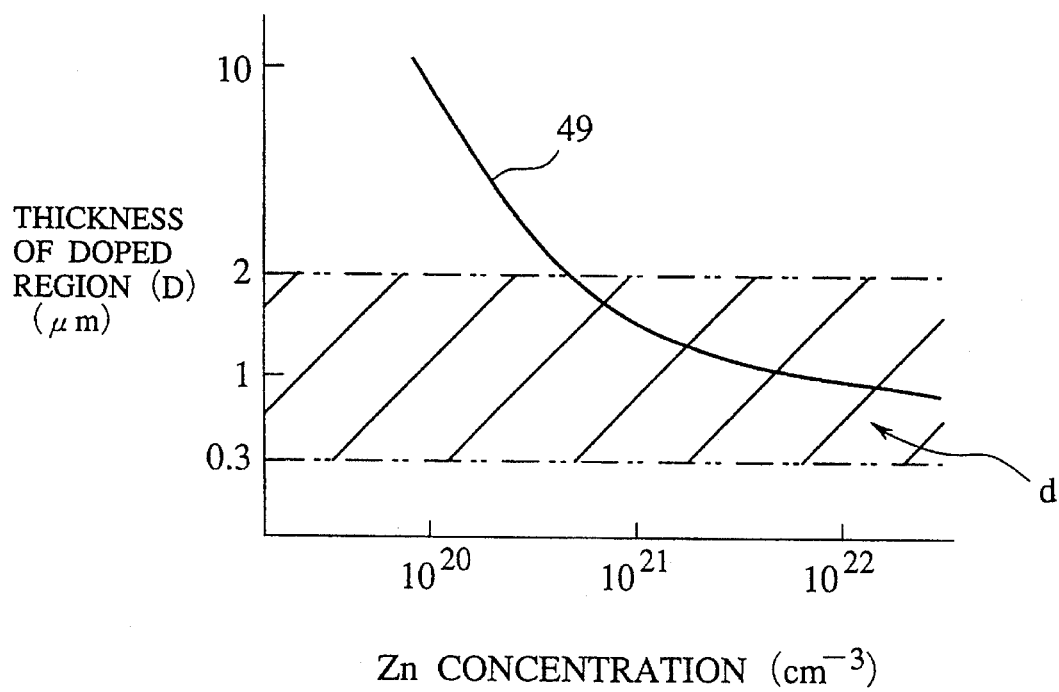
FIG. 17 is a graph illustrating light-emitting and light-sensing diode design parameters.

Conditions for designing a light-emitting and light-sensing diode are illustrated in FIG. 17. Zinc impurity concentration (zinc atoms per cubic centimeter) is shown on the horizontal axis, and thickness of the doped region (depth of the pn junction) is shown in µm on the vertical axis. Curve 49 indicates the maximum emission characteristic, which was determined by varying the zinc impurity concentration in steps, and finding, for each concentration, the pn junction depth that produced the maximum intensity of emitted light. Curve 49 was drawn by plotting the actual data points and fitting a smooth curve through them.

Even if the pn junction depth could be reduced to a uniform value of 0.5 µm or less, considering the absorption coefficient of visible light in GaAs$_{0.8}$P$_{0.2}$, the depth need not be less than 0.3 µm. The thickness D should therefore be in the range from 0.3 µm to 2 µm, which is indicated by the letter "d" in FIG. 17, and is marked by hatching. Within this range, maximum emission intensity is obtained with zinc concentrations of $5\times 10^{20}$ cm$^{-3}$ or higher, as indicated by curve 49. Extremely high concentrations of zinc cause extensive degradation of the crystal structure of the semiconductor substrate. To keep such damage within satisfactory limits, the zinc concentration should not exceed about $10^{23}$ cm$^{-3}$.

Next further embodiments of the invention will be described, which increase the photosensitivity of a light-emitting and light-sensing diode by increasing the area of the shallow part of the pn junction. These embodiments can be used with conventional pn junction depths and impurity concentrations.

Figure 18:
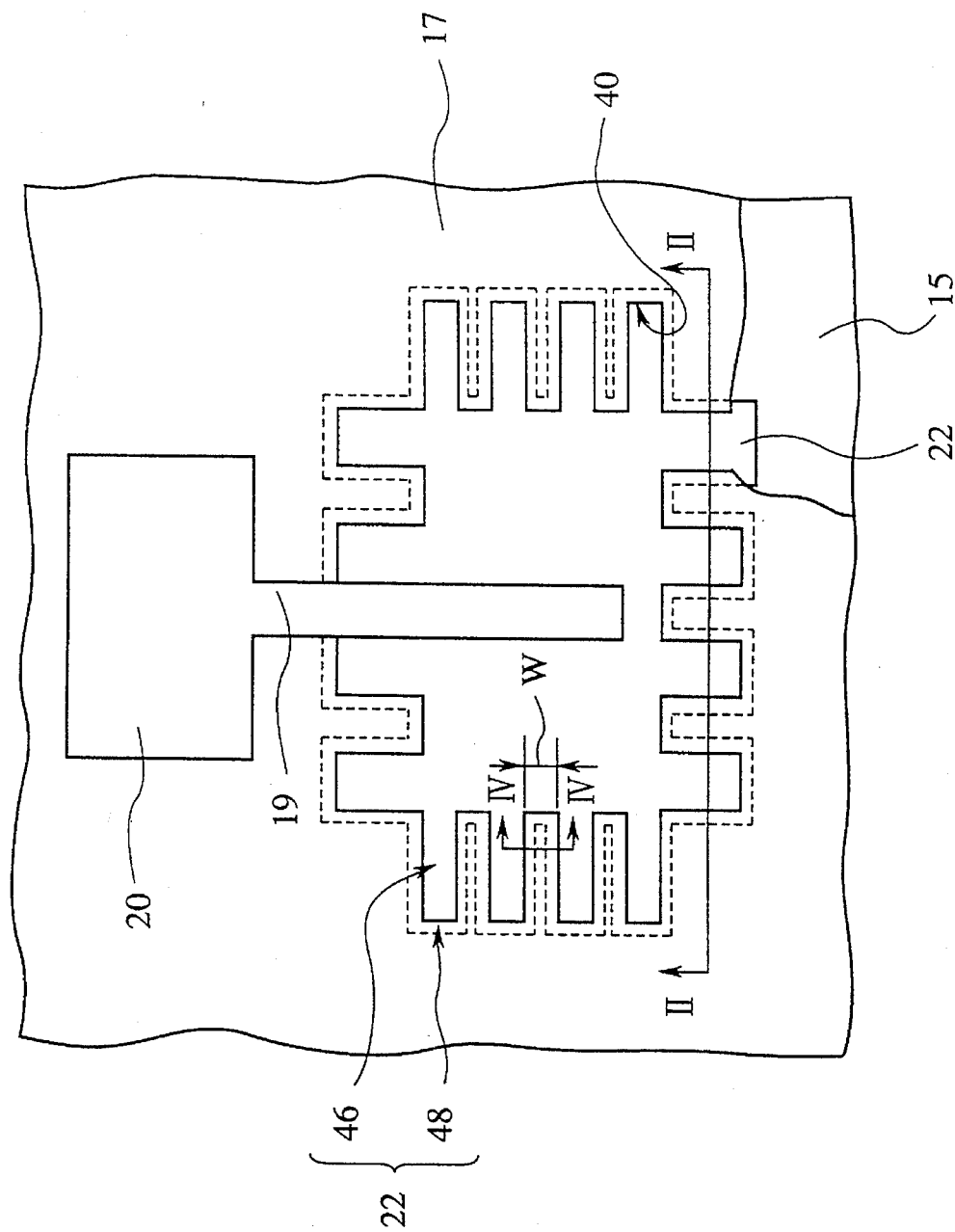
FIG. 18 is a plan view of a light-emitting and light-sensing diode in a second embodiment of the invention.

FIG. 18 illustrates a light-emitting and light-sensing diode in a second embodiment. The same reference numerals as in FIG. 2 and FIG. 15 are used to indicate the semiconductor substrate 15, insulating film 17, lead 19, bonding pad 20, doped region 22, and window 40. The doped region 22 comprises a deep part 46 and a shallow part 48, the shallow part 48 being formed at the edges of the window 40, underlying the insulating layer 17.

The main difference between FIG. 2 and FIG. 18 is that in FIG. 18 the window 40 has meandering edges, with a meander width W. The meanders greatly extend the total edge length of the window 40, hence the total area of the shallow part 48.

Another difference is that the lead 19 is narrower in FIG. 18 than in FIG. 2. The narrow lead 19 leaves more of the shallow part 48 of the doped region 22 uncovered, thereby also improving the photosensitivity of the diode. To assure sufficient electrical contact, the lead 19 extends into the central part of the doped region 22.

Figure 19:
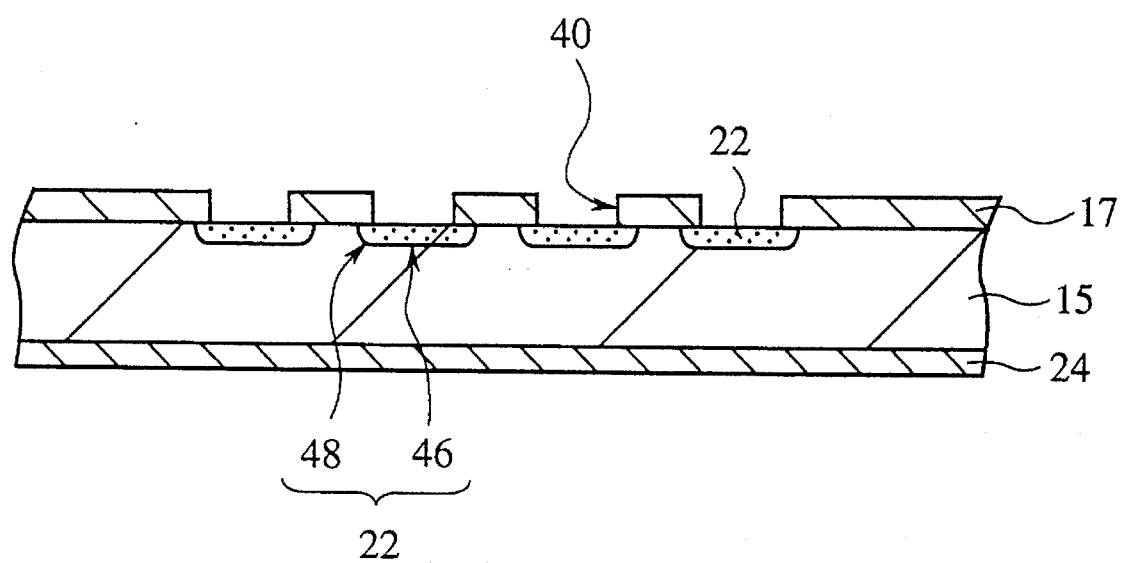
FIG. 19 is a sectional view on the line II—II in FIG. 18.

FIG. 19 shows a sectional view through line II–II in FIG. 18, crossing the meanders in one meandering edge of the window 40. Elements visible in FIG. 18 have the same reference numerals, and the metalized film 24 at the bottom of the substrate is also shown. The meanders provide shallow pn junctions at eight locations in this cross section. Without the meanders, there would be shallow pn junctions at just two locations.

Figure 20:
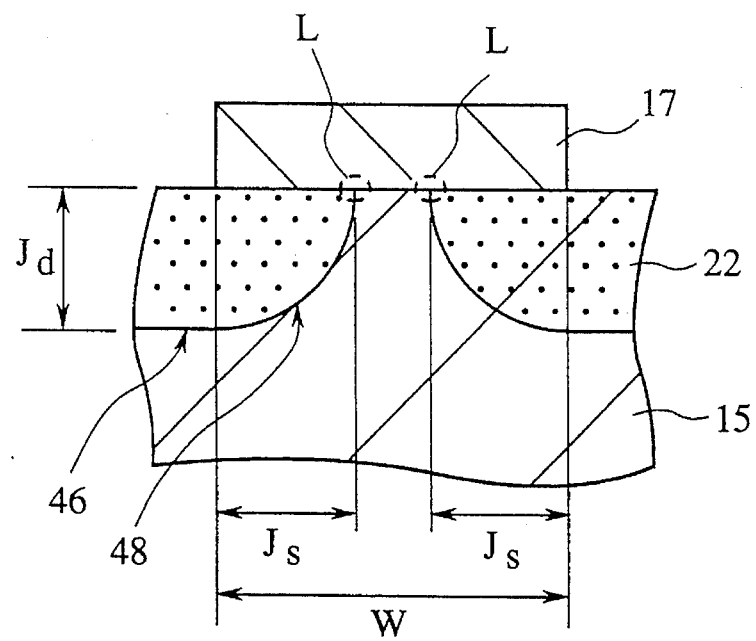
FIG. 20 is a sectional view on the line IV—IV in FIG. 18.

FIG. 20 is a sectional view through line IV—IV in FIG. 18, where the meander width is indicated by the letter W. The doped region 22 is formed by thermal diffusion with the insulating film 17 acting as a diffusion mask. Experience has shown that if diffusion proceeds vertically to a depth $J_d$, it will also proceed laterally under the insulating film 17 to a width $J_s$ equal to approximately $1.3\times J_d$. This lateral diffusion width $J_s$ limits the maximum width of the shallow part 48. To prevent overlap between adjacent edges of the shallow part 48, the width W of one finger of the insulating film 17 (the width W separating adjacent meanders) should be at least $2\times J_s$, or at least $2.6\times J_d$.

If, for example, the diffusion depth $J_d$ is 5 µm, then the meander width W should be at least 13 µm. if the zinc impurity concentration in the doped region 22 is the conventional $10^{19}$ to $10^{20}$ atoms/cm$^{-3}$ photoelectric conversion will be mainly confined to the regions indicated by dotted circles marked L at the very edges of the shallow part 48, where the junction depth ranges does not exceed about 0.7 μm. Despite this restriction of photosensitivity to the regions marked L, the meanders provide sufficient total photosensitive area.

Figure 21:
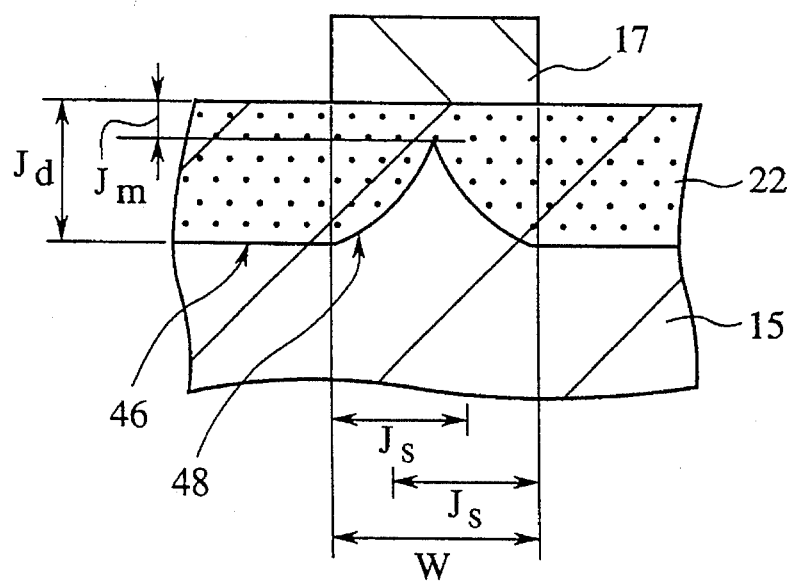
FIG. 21 is a sectional view similar to FIG. 20 but illustrating the result of insufficient meander separation.

FIG. 21 shows a case in which the meander width W is less than $2 \times J_s$ (less than about $2.6 \times J_d$), causing the edges of the shallow part 48 to overlap. The minimum junction depth $J_m$ in this cross section is therefore greater than zero. If the minimum junction depth is too great (greater than 2 μm, for example), then the effect of the meanders will be almost completely lost.

Figure 22:
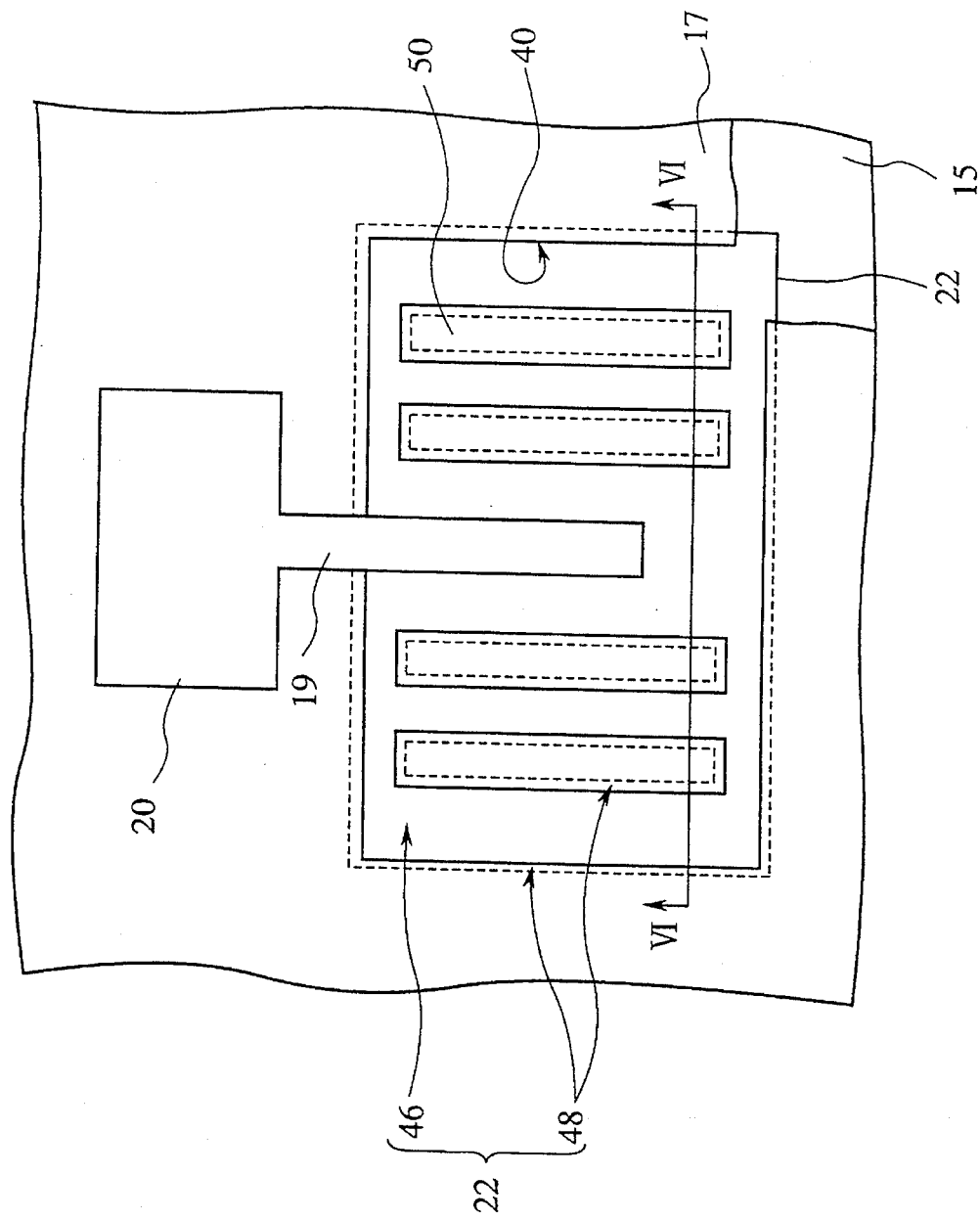
FIG. 22 is a plan view of a light-emitting and light-sensing diode in a third embodiment of the invention.

FIG. 22 illustrates a light-emitting and light-sensing diode in a third embodiment of the invention, using the same reference numerals as in FIG. 18. The window 40 in FIG. 22 has the form of a rectangle with straight edges, but with interior islands 50, so that shallow parts 48 of the doped region 22 are formed not only around the exterior edges of the window 40 but also around the edges of the interior islands 50. This scheme also increases the total area of the shallow part 48, resulting in greater photosensitivity.

Figure 23:
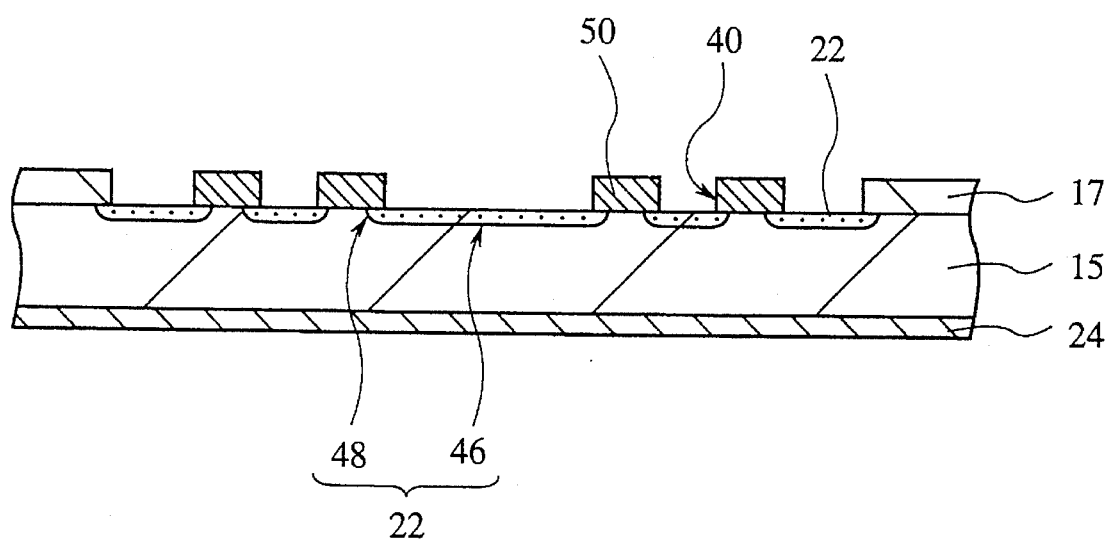
FIG. 23 is a sectional view on the line VI—VI in FIG. 22.

Referring to FIG. 23, which shows a sectional view through the line VI—VI in FIG. 22, the islands 50 comprise the same material as the insulating film 17, and are formed by patterning the insulating film 17 with a suitable mask so that the islands 50 are left when the insulating film 17 is etched to create the window 40. As can be seen in in FIG. 23, due to the presence of four islands 50, shallow pn junctions are formed in ten locations.

The total area of the shallow part 48 can obviously be increased by increasing the number of islands 50, to provide even greater sensitivity. If the islands 50 have the shape of long, thin rectangles, as in FIG. 22, then a large number of islands 50 can be provided without significantly reducing the area of the deep part 46 of the doped region 22.

Figure 24:
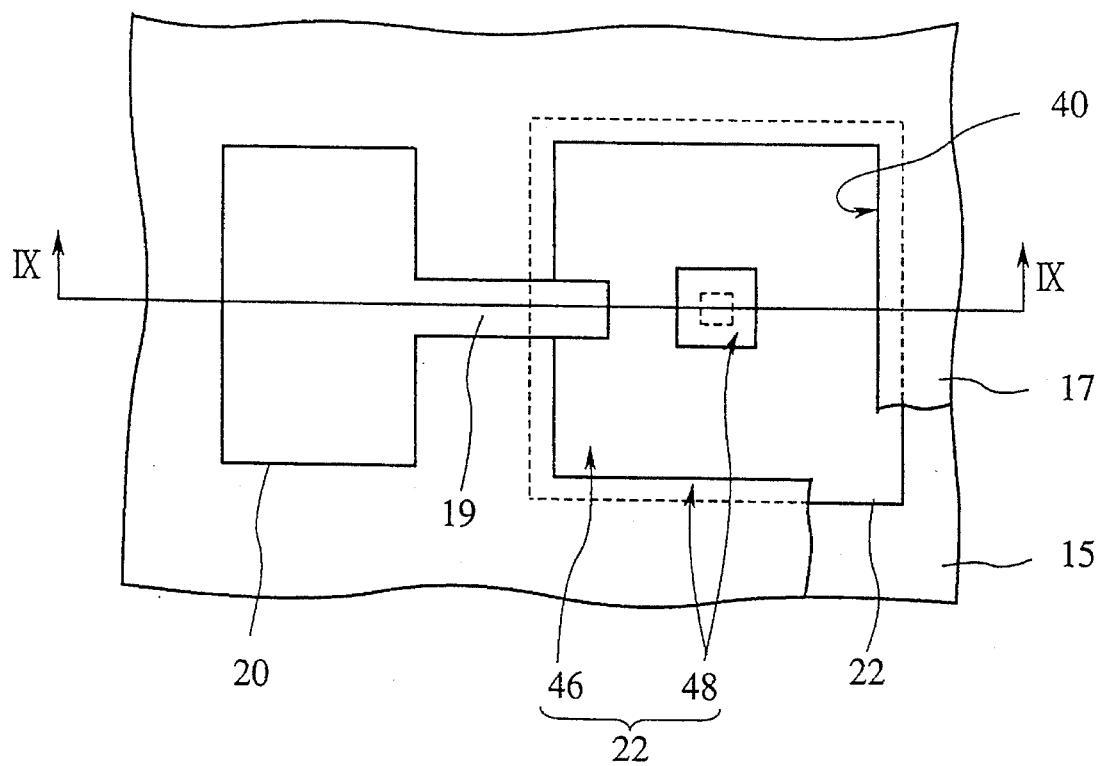
FIG. 24 is a plan view of a light-emitting and light-sensing diode in a fourth embodiment of the invention.

FIG. 24 illustrates a light-emitting and light-sensing diode in a fourth embodiment of the invention, using the same reference numerals as in FIG. 22. This embodiment has a single square island 50, located in the center of the window 40, instead of a plurality of rectangular islands 50 as in FIG. 22.

Figure 25:
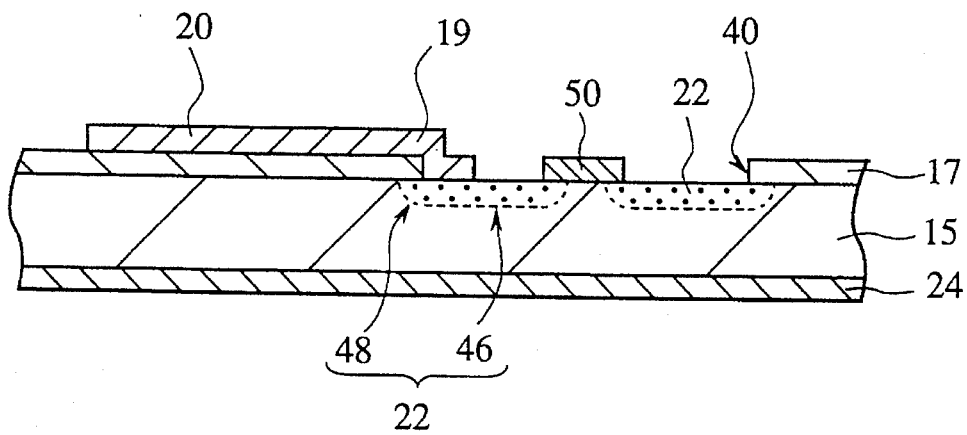
FIG. 25 is a sectional view on the line IX—IX in FIG. 24.

FIG. 25 shows a sectional view along the line IX—IX in FIG. 24. In this particular section shallow pn junctions are formed at four locations instead of two, doubling the photosensitive area. If the total area of the island 50 equal to one-fourth the total area of the window 40 and diffusion depth is 5 μm, then the window 40 will increase the total area of the shallow part 48 by a factor of approximately 1.3.

Compared with FIG. 22, FIG. 24 provides less additional shallow pn junction area, but requires a less complex mask pattern.

Figure 26:
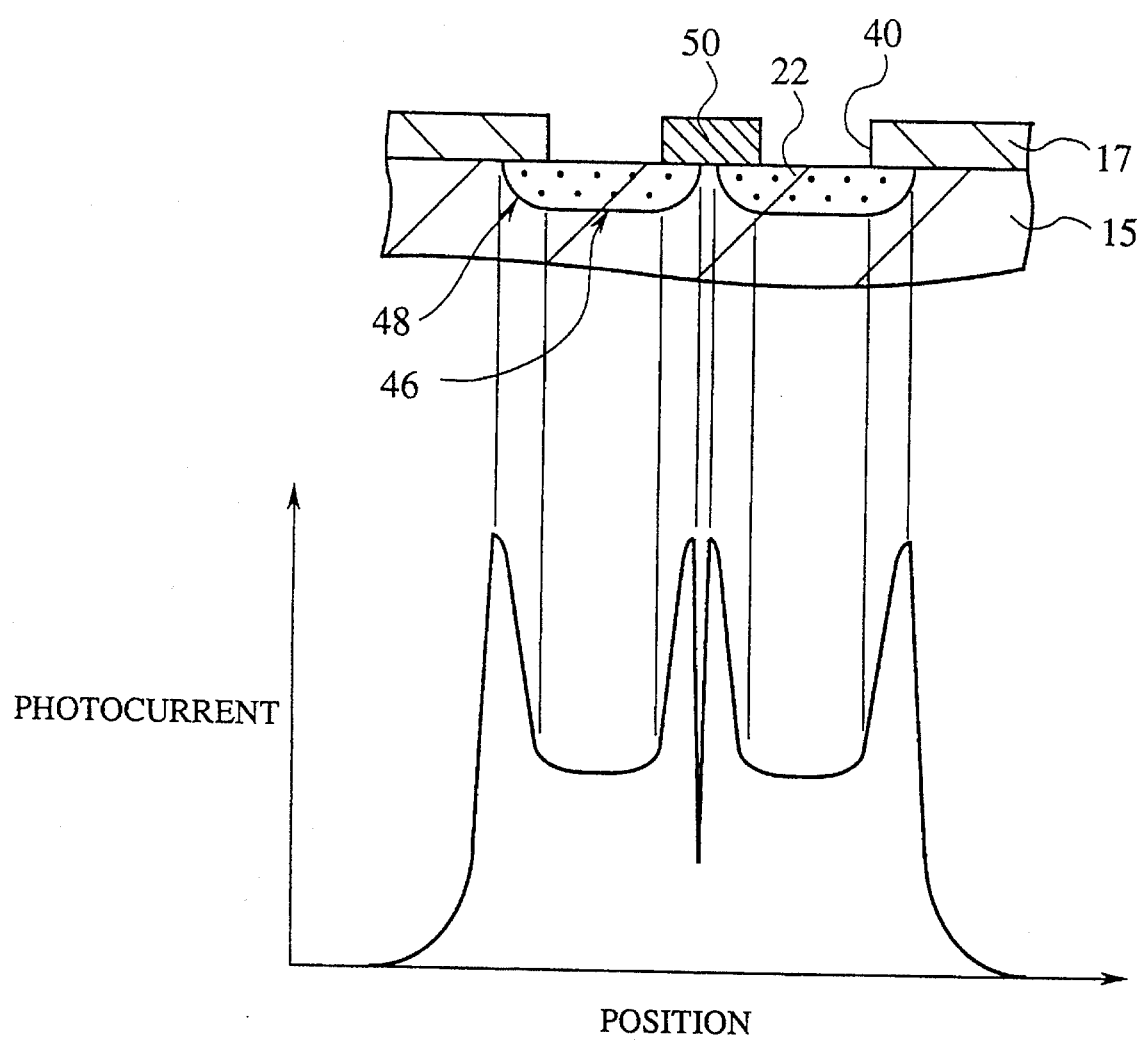
FIG. 26 illustrates anticipated results of photocurrent measurements for the diode in FIG. 24.

If the experiment described in FIG. 8 were to be repeated for the diode in FIG. 24, results as shown in FIG. 26 could be expected, showing sensitivity peaks not only at the outer edges of the doped region but also at its inner edges, around the island 50. The vertical and horizontal axes in FIG. 26 have the same meaning as in FIG. 8, and the reference numerals match those in FIG. 24 to FIG. 25. FIG. 26 is not drawn to scale, but merely shows the anticipated shape of the photocurrent curve, with three peaks instead of just two. Depending on the dimensions of the island 50, the central peak may be divided by a notch, as shown in the drawing.

Figure 27:
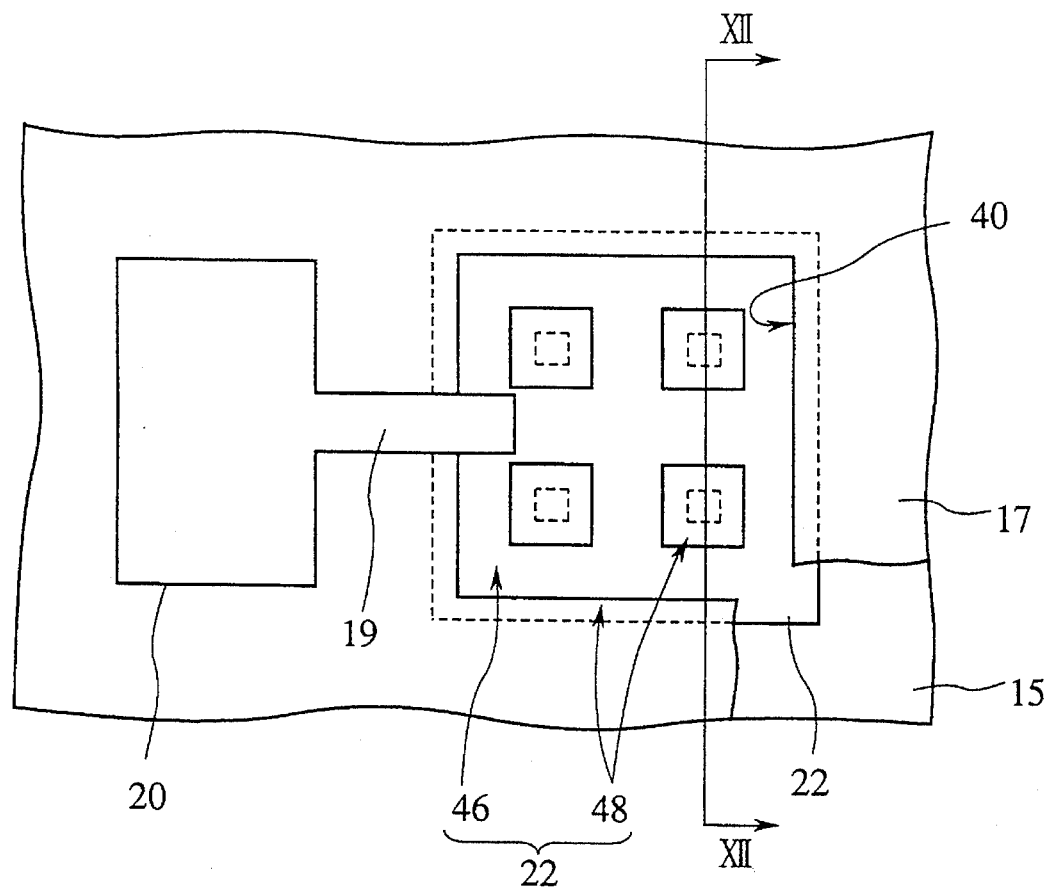
FIG. 27 is a plan view of a light-emitting and light-sensing diode in a fifth embodiment of the invention.

FIG. 27 illustrates a light-emitting and light-sensing diode in a fifth embodiment of the invention using the same reference numerals as in FIG. 22. This embodiment has four square islands 50 located within the window 40.

Figure 28:
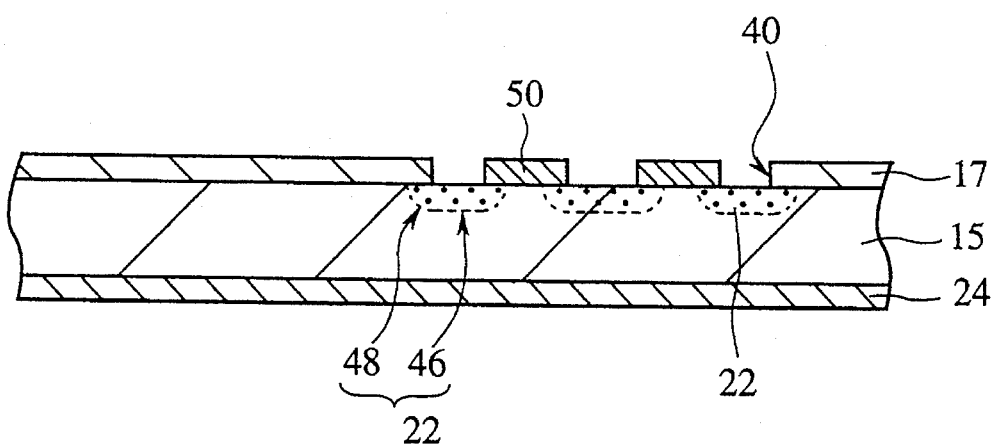
FIG. 28 is a sectional view on the line XII—XII in FIG. 27.

FIG. 28 shows a sectional view along the line XII—XII in FIG. 27. In this cross section, shallow pn junctions are formed at six locations instead of two. If the total area of the islands 50 is equal to one-fourth the area of the window 40 and the diffusion depth is 5 μm, then the islands 50 will increase the total area of the shallow part 48 by a factor of approximately 1.7.

Compared with FIG. 24, FIG. 27 provides additional shallow pn junction area. For the same total island area, using a larger number of smaller islands 50 provides more edge length, hence a larger shallow part 48. Compared with FIG. 22, FIG. 27 also provides a more uniform distribution of horizontal and vertical edges.

Figure 29:
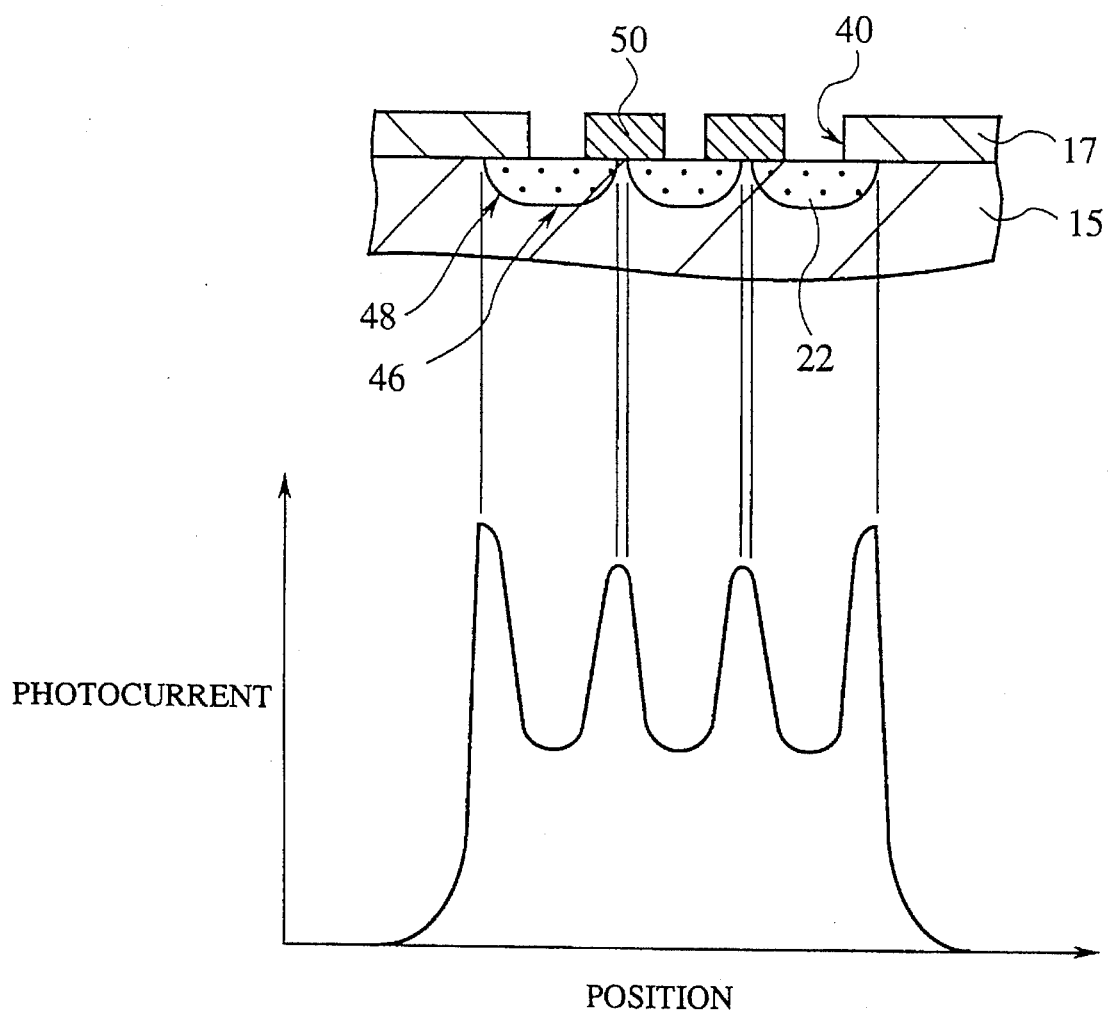
FIG. 29 illustrates anticipated results of photocurrent measurements for the diode in FIG. 27.

FIG. 29 shows the anticipated results if the experiment described in FIG. 8 were to be repeated for the diode FIG. 27 and FIG. 28. The vertical and horizontal axes are as in FIG. 8, and the reference numerals as in FIG. 27 and FIG. 28. This time there are four peaks.

Photosensitivity is proportional to total photocurrent, that is, to the areas under the curves in FIG. 26 and 29. It should be obvious from these figures that increasing the number of peaks, by providing additional island 50, will increase the photosensitivity of the diode.

FIG. 22, FIG. 24 and FIG. 27 show only a few off many possible configurations in which the window 40 has edges that form multiple closed curves, comprising an outer closed curve and one or more inner closed curves. In FIG. 22 the inner closed curves are four rectangles. In FIG. 24 there is one square inner closed curve. In FIG. 27 there are four square inner closed curves, disposed side-by-side in two orthogonal directions to create a grid of squares. The invention is not restricted to these particular arrangements, however; nor is it necessary for the outer closed curve to be rectangular as in FIG. 22, FIG. 24 and FIG. 27.

Fabrication processes for the diodes in FIG. 18 to FIG. 28 are similar to the process described in FIG. 10 to FIG. 15, except that the diffusion depth and concentration need not be as stated in the description of FIG. 9. The impurity must be introduced into the semiconductor substrate 15 by thermal diffusion. For the diodes in FIG. 22, FIG. 24 and FIG. 27, when the insulating film 17 is patterned to form the window 40, islands 50 of the insulating film are left intact inside the window 40. For the diode in FIG. 18, the insulating film 17 is removed entirely from the window 40, but the window 40 has meandering edges. In this way the area of the shallow part 48 is increased simply by altering the fabrication mask pattern of the window 40 so as to increase the total length of its edges, without requiring additional process steps.

The diodes in FIG. 22, FIG. 24, and FIG. 27 can also be fabricated by removing the insulating film entirely from the window 40, then forming islands 50 of another masking material inside the window 40.

Figure 30:
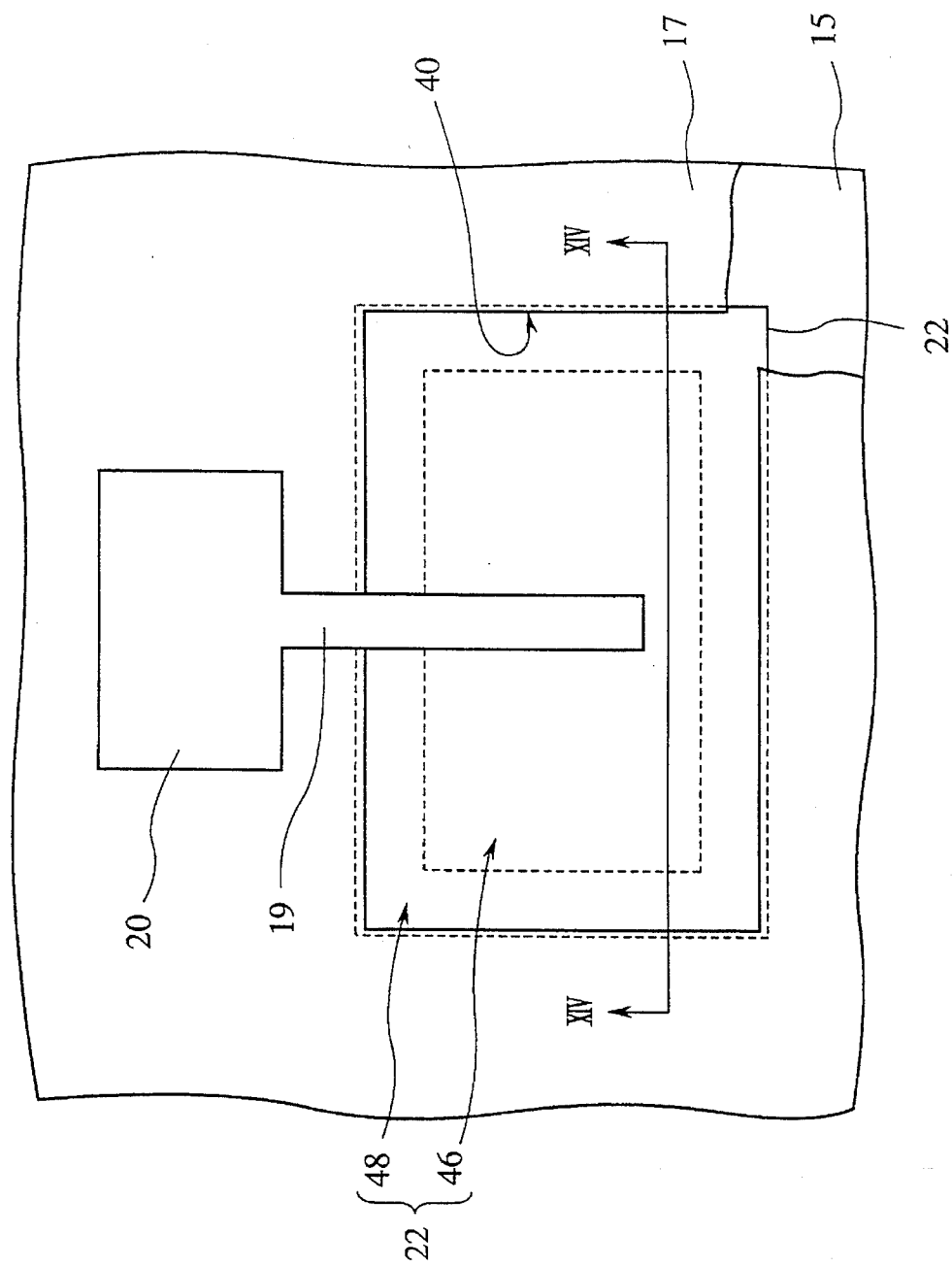
FIG. 30 is a plan view of a light-emitting and light-sensing diode in a sixth embodiment of time invention.

FIG. 30 illustrates a light-emitting and light-sensing diode in a sixth embodiment of the invention. The same reference numerals as in FIG. 2 and FIG. 15 are used to indicate the semiconductor substrate 15, insulating film 17. lead 19, bonding pad 20, window 40, and doped region 22 with deep part 46 and shallow part 48.

One difference between this embodiment and the preceding embodiments is that the shallow part 48 now extends over a considerable portion of the doped region 22 inside the window 40 and, like the deep part 46, has a substantially uniform pn junction depth. In contrast, in FIG. 18 to FIG. 28 the shallow part 48 was confined to the very edges of the doped region 22, and had a non-uniform pn junction depth, consisting of lateral diffusion areas in which the pn junction sloped upward as in FIG. 20.

As will become apparent, the doped region 22 in FIG. 30 need not be formed by thermal diffusion. The total area of the shallow part 48 can be increased without the need for islands 50 as in FIG. 22 to FIG. 29 or a meandering edge as in FIG. 18. Moreover, the area ratio of the deep part 46 to the shallow part 48 can be easily controlled, by increasing or decreasing the distance to which the shallow part 48 extends inside the window 40.

Since light is sensed primarily in the shallow part 48, it should be shallow enough so that typical wavelengths of visible light can reach the pn junction. As discussed above, in a $GaAs_{0.8}P_{0.2}$ substrate, with the conventional impurity concentration of $10^{19}$ to $10^{20}$ atoms/cm$^3$ the depth of the shallow part 48 of the doped region 22 preferably does not exceed 0.7 μm, permitting green light to reach the pn junction.

Light is emitted primarily from the deep part 46, the depth of which should be optimized for maximum emission at the peak emitted wavelength. For a $GaAs_{0.8}P_{0.2}$ substrate and the above impurity concentration, the depth of the deep part 46 should be at least 5 μm.

Next a process for fabricating the diode in FIG. 30 will be illustrated in FIG. 31 to FIG. 37, which show sectional views along the line XIV—XIV in FIG. 30. The steps that form the lead 19 and bonding pad 20 are the same as in FIG. 15, so they will be omitted from the description.

Figure 31:
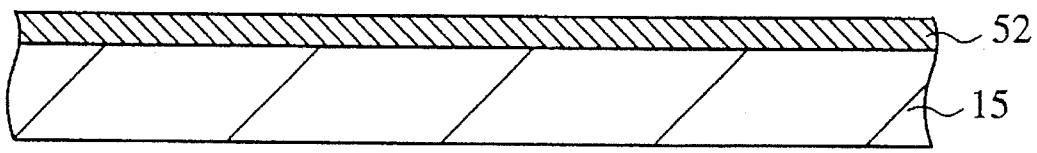
FIG. 31 illustrates a first step in a first method of fabrication of the sixth embodiment.

Referring to FIG. 31, the first step is to deposit a first mask layer 52 on a semiconductor substrate 15 of n-type $GaAs_{0.8}P_{0.2}$. The first mask layer 52 should comprise a material that blocks the passage of the p-type impurity that will be introduced into the substrate 15 to form the diode.

Figure 32:
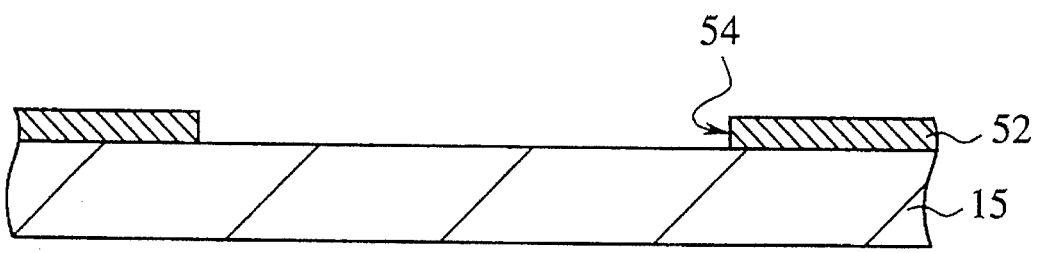
FIG. 32 illustrates a second step in the first method.

Referring to FIG. 32, in the next step the first mask layer 52 is patterned by photolithography and etching to form a first window 54.

Figure 33:
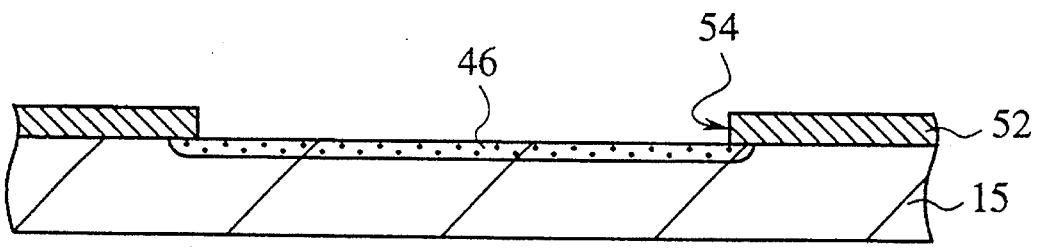
FIG. 33 illustrates a third step in the first method.

Referring to FIG. 33, in the next step a p-type impurity such as zinc is introduced through the first window 54 by a suitable process such as thermal diffusion or ion implantation, under diffusion or implantation conditions adapted to form the deep part 46 of the doped region. Then the remaining first mask layer 52 is removed.

Figure 34:
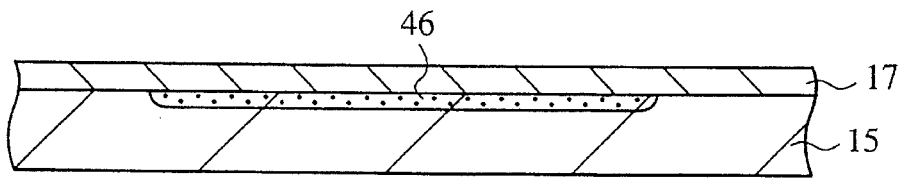
FIG. 34 illustrates a fourth step in the first method.

Referring to FIG. 34, in the next step the insulating film 17 is deposited on the surface, covering the deep part 46 and adjacent areas.

Figure 35:
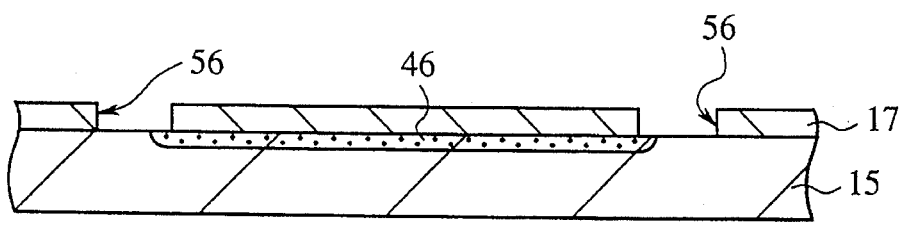
FIG. 35 illustrates a fifth step in the first method.

Referring to FIG. 35, in the next step the insulating film 17 is patterned to form a second window 56 over at least part of the edges of the deep part 46 and adjacent exterior areas. To form the diode shown in FIG. 30, the second window 56 should have the shape of a single wide, closed, rectangular loop completely surrounding the deep part 46. In general, the second window 56 can have other forms: for example, it may only partly surround the deep part 46, or it may comprise two or more separate windows extending outward from various portions of the edge of the deep part 46.

Figure 36:
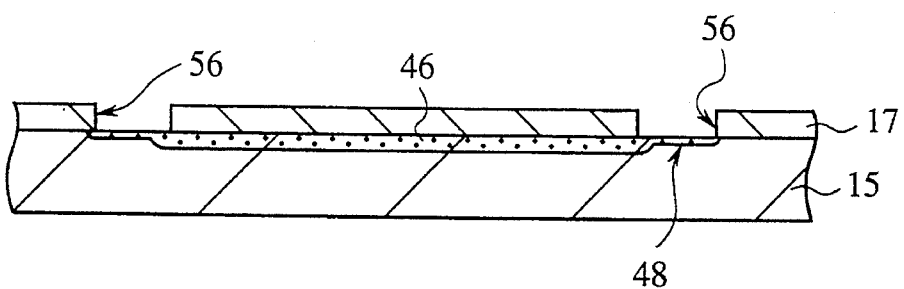
FIG. 36 illustrates a sixth step in the first method.

Referring to FIG. 36, in the next step of the p-type impurity (e.g. zinc) is thermally diffused through the second window 56 under diffusion conditions such as to form the shallow part 48 of the doped region.

Figure 37:
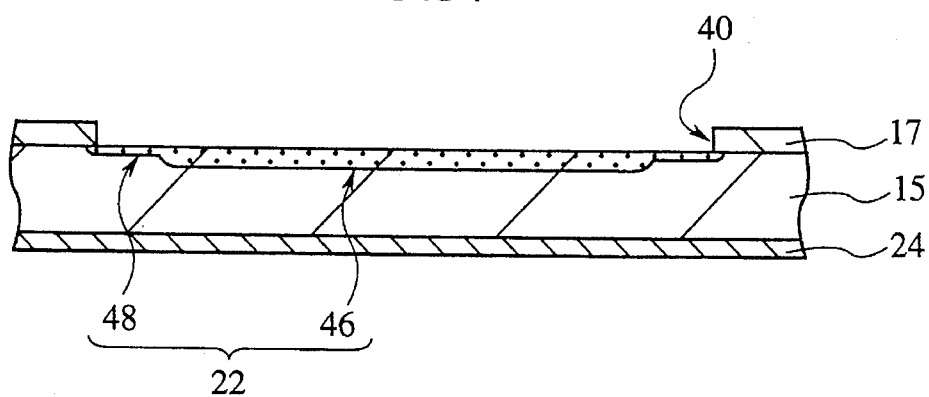
FIG. 37 illustrates a seventh step in the first method.

Referring to FIG. 37, in the last step that part of the insulating film 17 which overlies the deep part 46 is selectively removed, leaving substantially the entire doped region 22, comprising both the deep and shallow parts 46 and 48, exposed through a single large window 40. In addition, a metalized film 24 is deposited on the bottom surface of the semiconductor substrate 15. The diode now has the configuration illustrated in plan view in FIG. 30.

If the insulating film 17 is sufficiently transparent to the wavelength of light emitted by the diode in its light-emitting mode, then the step of removing the part of the insulating film 17 which overlies the deep part 46 of the doped region can be omitted without adversely affecting the light-emitting performance of the diode.

Next an alternative procedure for fabricating the diode in FIG. 30 will be illustrated in FIG. 38 to FIG. 42. These figures also show sectional views on the line XIV—XIV in FIG. 30. Again, the steps that form the lead 19 and bonding pad 20 will be omitted from the description.

Figure 38:
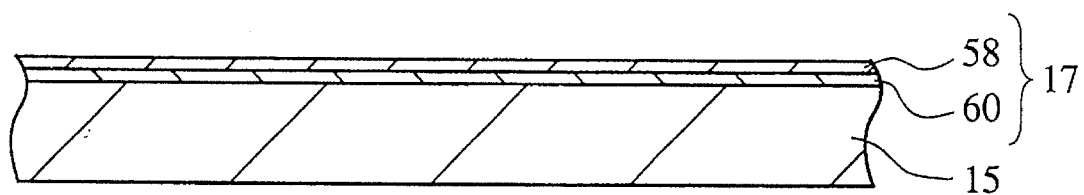
FIG. 38 illustrates a first step in a second method of fabrication of the sixth embodiment.

Referring to FIG. 38, in the first step the insulating film 17 is deposited on a semiconductor substrate 15 of, for example, $GaAs_{0.8}P_{0.2}$. The insulating film 17 comprises two separate layers: an upper layer 58 and a lower layer 60. The lower layer 60 is deposited first and the upper layer 58 second. The two layers have different compositions, such that the upper layer 58 can be etched by an etching fluid or gas that leaves the lower layer 60 substantially intact. For example, the upper layer 58 may comprise silicon nitride and the lower layer 60 silicon oxide. The combined thickness of the upper layer 58 and lower layer 60 should be sufficient to substantially block the passage of the p-type impurity that will be used.

Figure 39:
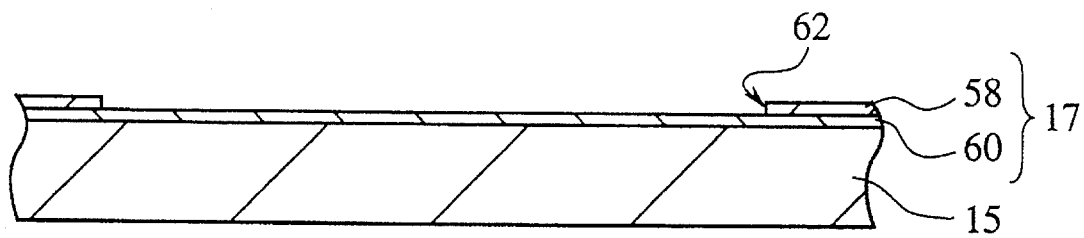
FIG. 39 illustrates a second step in the second method.

Referring to FIG. 39, in the next step the upper layer 58 is patterned by photolithography and etching to form a first window 62. The plan area of the first window 62 is identical to the plan area of the window 40 in FIG. 30. The etchant used in this step leaves the lower layer 60 substantially intact as described above. For example, the etching can be performed with carbon tetrafluoride ($CF_4$) etching gas, which etches silicon nitride much faster than it etches silicon oxide.

Figure 40:
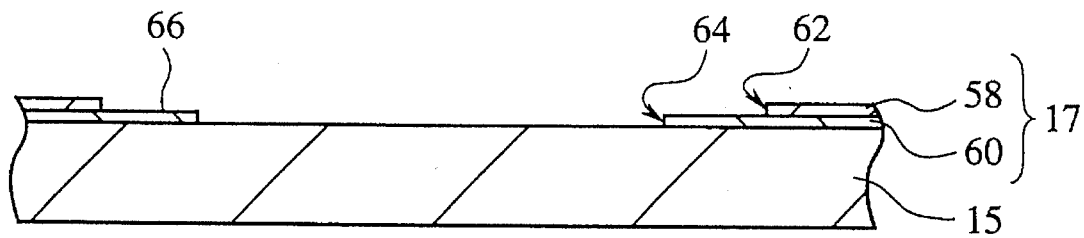
FIG. 40 illustrates a third step in the second method.

Referring to FIG. 40, in the next step the lower layer 60 is patterned by photolithography and etching to form a second window 64. The plan area of the second window 64 is smaller than the plan area of the first window 62, and the second window 64 is disposed within the area of the first window 62. The etching can be performed with, for example, hydrofluoric acid (HF).

This step leaves a shelf 66 of the lower layer 60 projecting inside the first window 62. To create the diode shown in FIG. 30, the shelf 66 should have the form of a single wide, closed, rectangular loop, but, in general the shelf 66 can have other forms, as mentioned in connection with the second window 56 in FIG. 35. The shelf 66 need not be disposed around the periphery of the first window 62, but can be located at any one or more sites within the first window 62.

The thickness of the shelf 66 should be sufficient to impede but not completely block the passage of the p-type impurity. The thickness of the shelf 66 is controlled by the original thickness of the lower layer 60 and the etching rate in the previous step that formed the first window 62.

Figure 41:
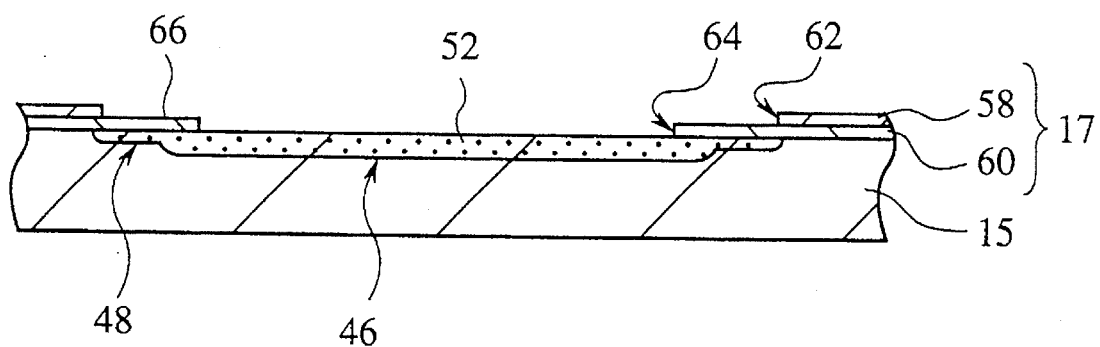
FIG. 41 illustrates a fourth step in the second method.

Referring to FIG. 41, in the next step a p-type impurity such as zinc is introduced through the first window 62, second window 64, and shelf 66 into the semiconductor substrate 15 by a suitable process such as thermal diffusion or ion implantation. The diffusion or implantation conditions are selected so as to form a deep part 46 under the second window 64. The depth of impurity penetration into the semiconductor substrate 15 is controlled by the shelf 66 so that a shallow part 48 is formed under the shelf 66.

Figure 42:
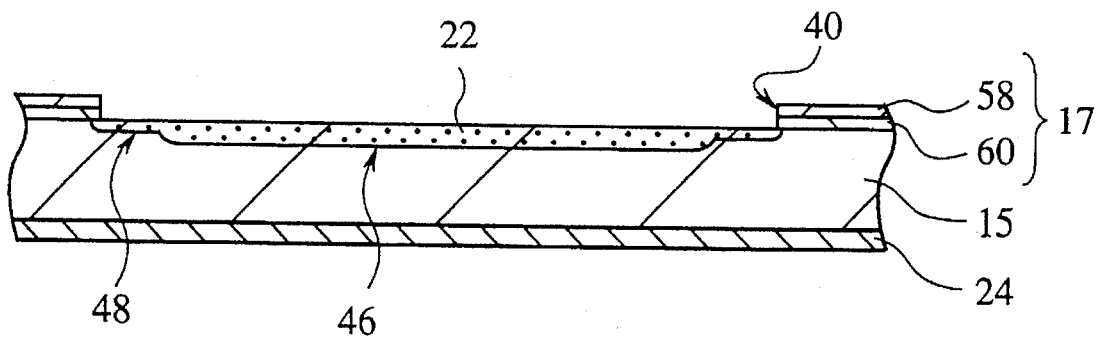
FIG. 42 illustrates a fifth step in the second method.

Referring to FIG. 42, in the next step the shelf 66 is removed by etching, leaving a single window 40, and a metalized film 24 is deposited on the underside of the semiconductor substrate 15. If the shelf 66 is sufficiently transparent to the wavelengths of light to be sensed (i.e. to visible wavelengths), it need not be removed.

The process illustrated in FIG. 38 to FIG. 42 has the advantage that the deep part 46 and shallow part 48 are formed simultaneously, requiring only a single diffusion or implantation step. The process is also self-aligning. The shallow part 48 can be located anywhere within the window 40, and photolithography masks used to form the first window 62 and second window 64 need not be aligned with a high degree of accuracy. Alignment error (within reasonable limits) will not alter the areas of the deep part 46 and shallow part 48, so it will not affect the performance of the diode.

Figure 43:
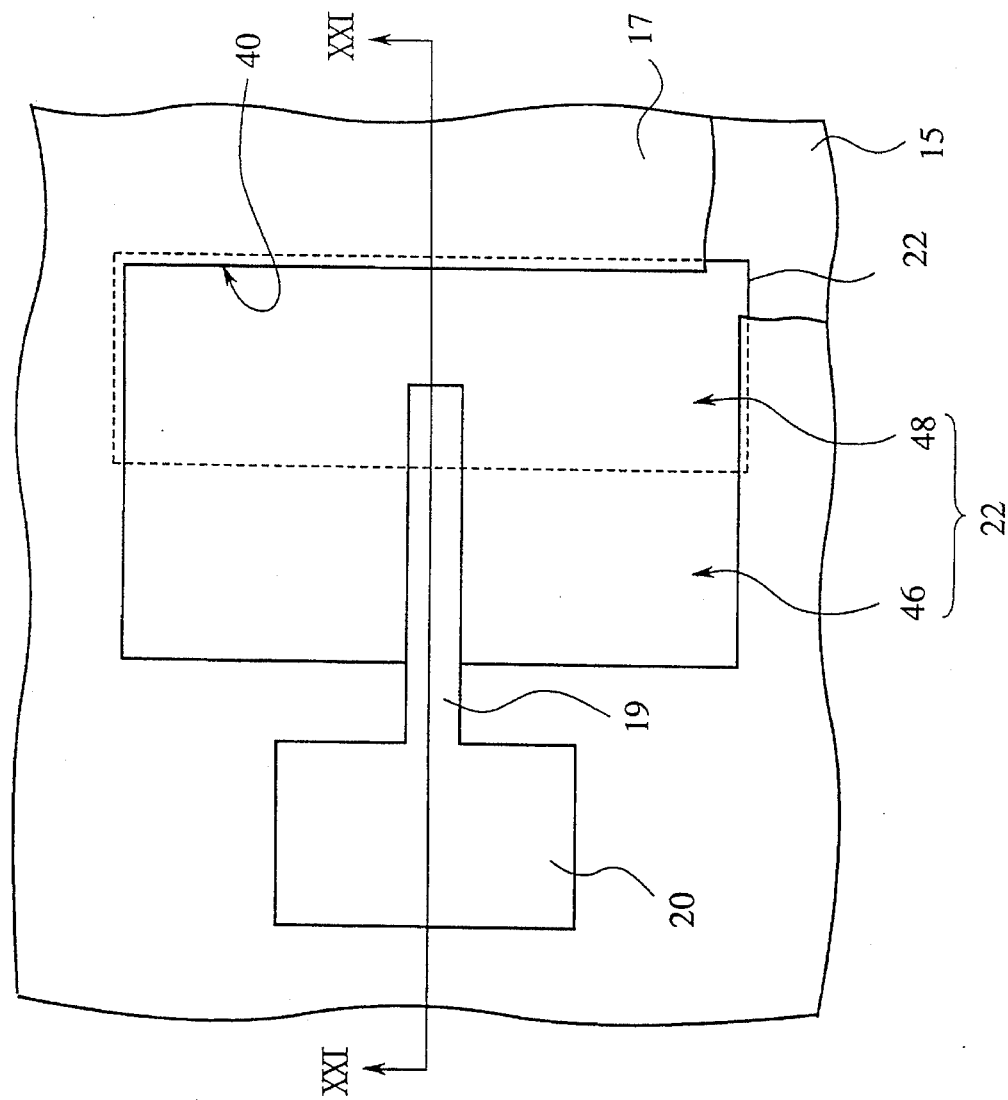
FIG. 43 is a plan view of a light-emitting and light-sensing diode in a seventh embodiment of the invention.
Figure 44:
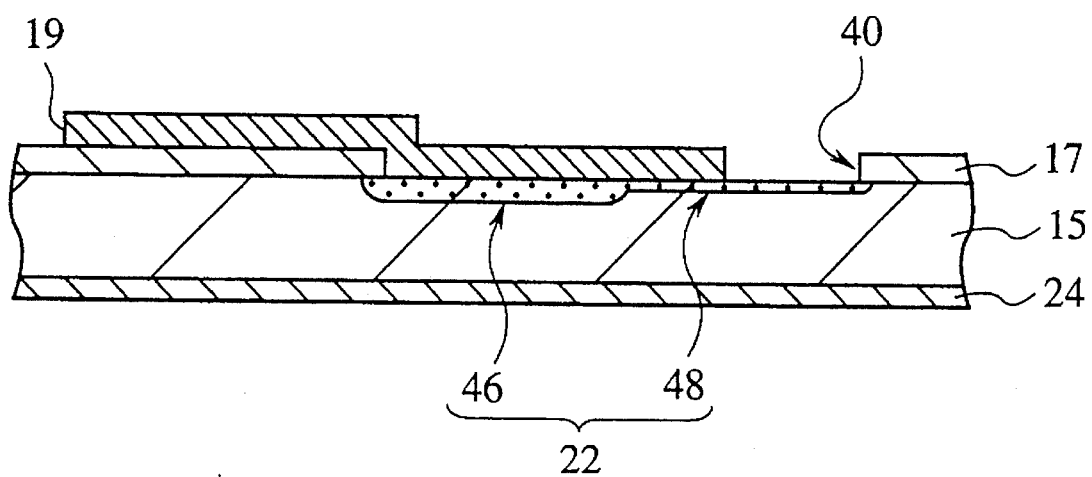
FIG. 44 is a sectional view on the line XXI—XXI in FIG. 43.

FIG. 43 to FIG. 44 illustrate a light-emitting and light-sensing diode in a seventh embodiment of the invention, FIG. 43 being a plan view and FIG. 44 a sectional view on the line XXI—XXI in FIG. 43. The same reference numerals are used as in FIG. 30 to FIG. 37. In this embodiment the window 40 is divided into two substantially equal halves, the deep part 46 being formed in the left half and the shallow part 48 in the right half. The halves are side-by-side, instead of the shallow part 48 surrounding the deep part 46 as in FIG. 30. This embodiment can be fabricated by either the process in FIG. 31 to FIG. 37, or the alternative process in FIG. 38 to FIG. 42.

The deep part 46 and shallow part 48 need not have equal areas. The ratio of their areas can be set to any desired value by moving the boundary between them to the right or left.

Figure 45:
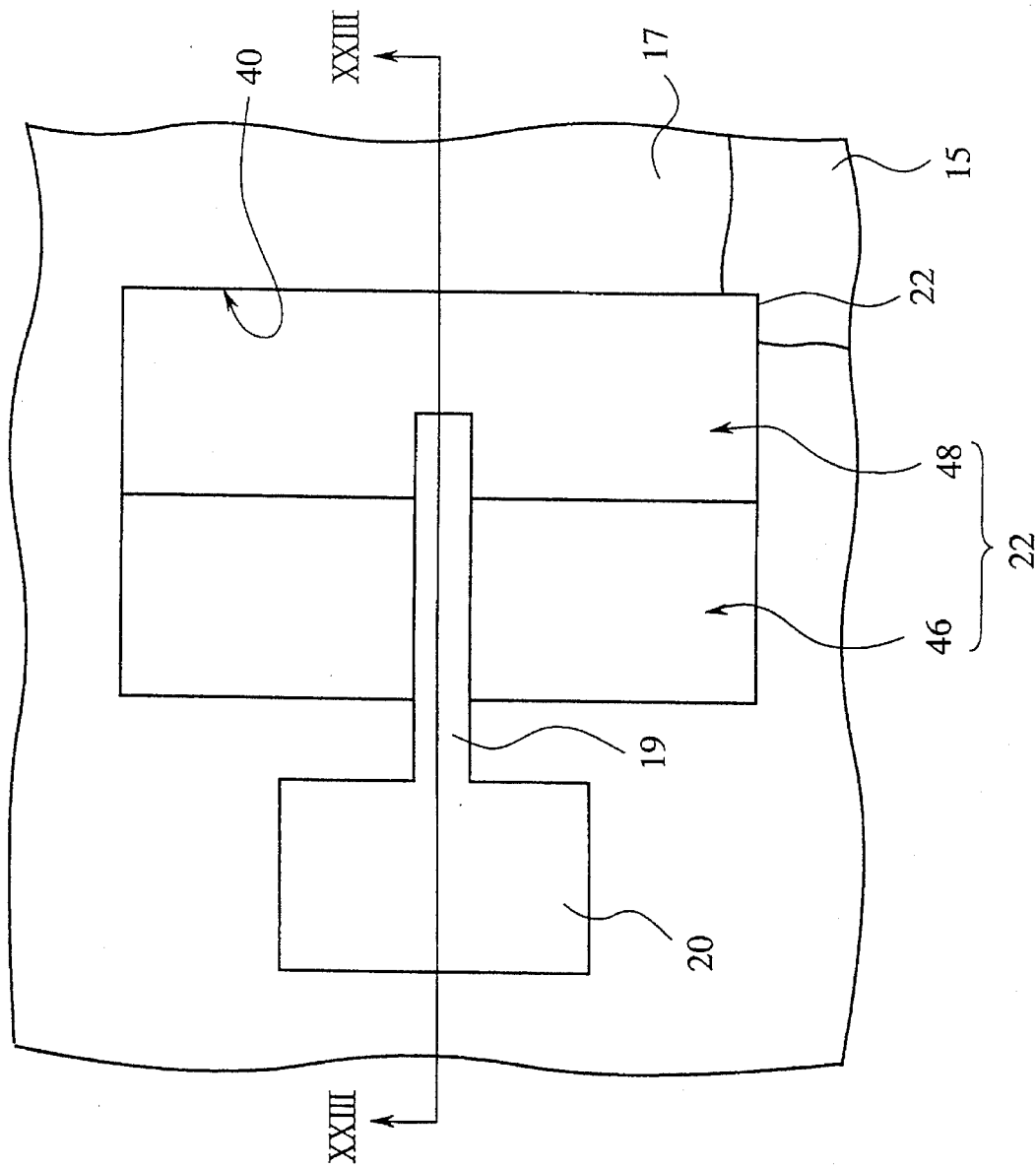
FIG. 45 is a plan view of a light-emitting and light-sensing diode in an eighth embodiment of the invention.

FIG. 45 shows a plan view of a light-emitting and light-sensing diode in an eighth embodiment of the invention. FIG. 45 is generally similar to FIG. 43, and uses the same reference numerals. However, these two embodiments are fabricated by different processes, causing a structural difference that will be explained later.

A fabrication process for the eighth embodiment will be described with reference to FIG. 46 to FIG. 51, which show sectional views on the line XXIII—XXIII in FIG. 45.

Figure 46:
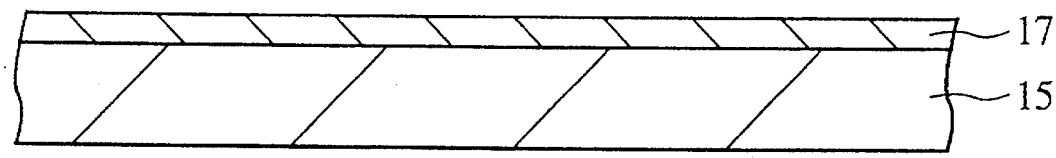
FIG. 46 illustrates a first step in the fabrication of time eighth embodiment.

Referring to FIG. 46, in the first step an insulating film 17 is deposited on a semiconductor substrate 15 of, for example, n-type $GaAs_{0.8}P_{0.2}$.

Figure 47:
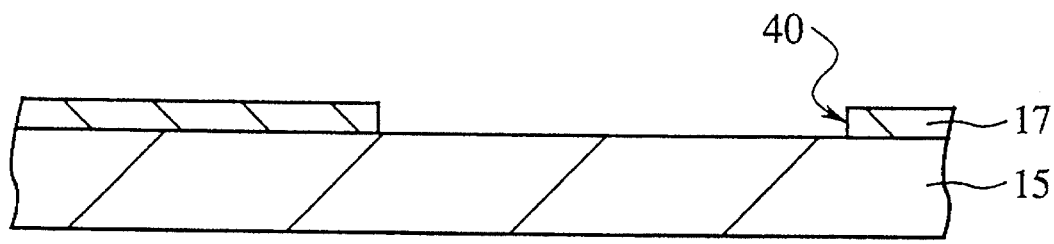
FIG. 47 illustrates a second step in the fabrication of the eighth embodiment.

Referring to FIG. 47, in the next step the insulating film 17 is patterned to form the window 40.

Figure 48:
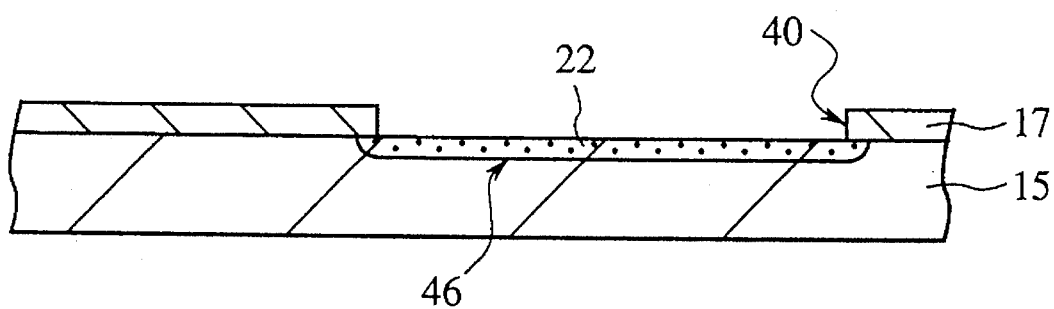
FIG. 48 illustrates a third step in the fabrication of the eighth embodiment.

Referring to FIG. 48, in the next step an impurity such as zinc is introduced into the semiconductor substrate 15 through the window 40 by a suitable process such as thermal diffusion, the insulating film 17 acting as a diffusion mask. The diffusion conditions are set so that the resulting doped region 22 has a depth equal to the desired depth of the deep part 46. The left half of the doped region 22 in FIG. 48 will become the deep part 46.

Figure 49:
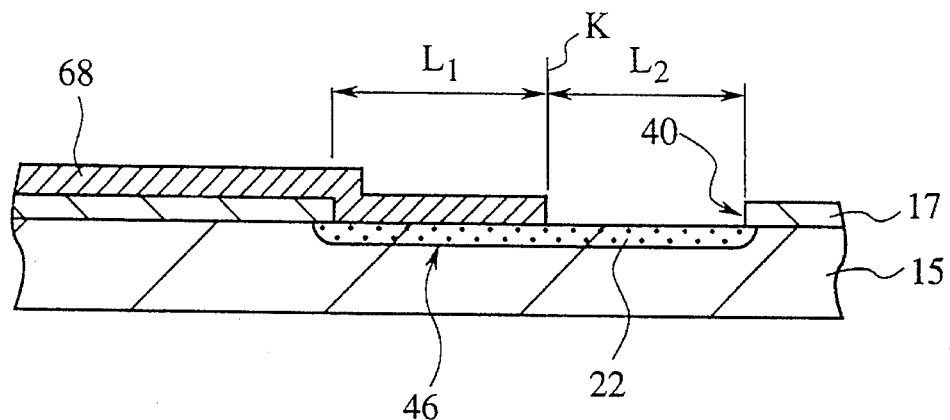
FIG. 49 illustrates a fourth step in the fabrication of the eighth embodiment.

Referring to FIG. 49, in the next step an etching mask 68 comprising, for example, a photoresist material, is deposited and patterned by photolithography so that it extends over part of the doped region 22. The covered part of the doped region 22 and the exposed part have widths $L_1$ and $L_2$ in the drawing. The covered part will be left as the deep part 46. The ratio of the area of the deep part 46 to the shallow part 48 will be $L_1:L_2$, and this ratio can be adjusted by moving the boundary K between the covered and exposed parts of the doped region 22.

Figure 50:
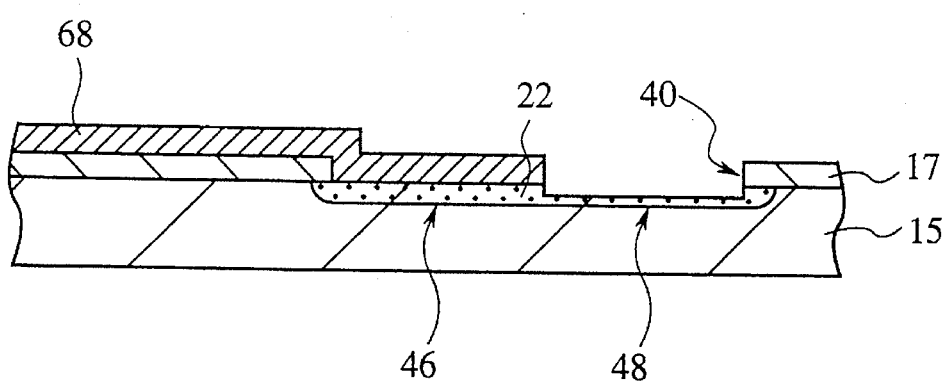
FIG. 50 illustrates a fifth step in the fabrication of the eighth embodiment.

Referring to FIG. 50, in the next step the doped region 22 is etched, where exposed by the window 40 and not covered by the etching mask 68. This etching step reduces the thickness of the etched portion of the doped region 22 so that it becomes the shallow part 48. After this step the etching mask 68 is removed.

Figure 51:
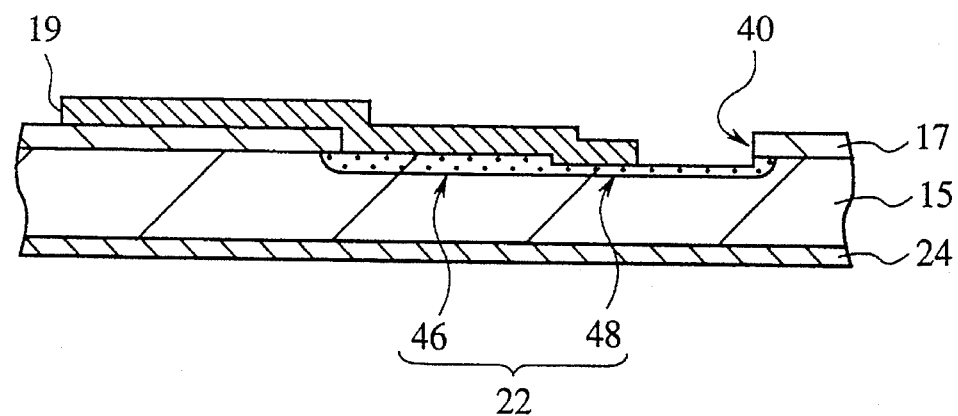
FIG. 51 illustrates a sixth step in the fabrication of the eighth embodiment.

Referring to FIG. 51, in the next step the conductive pattern (of which only the lead 19 is shown in the drawing) and metalized film 24 are created. As shown in FIG. 45, the lead 19 forms a narrow strip making electrical contact with the doped region 22; it covers only a small portion of the deep part 46. In FIG. 45 to FIG. 51 the lead 19 also makes electrical contact with a small portion of the shallow part 48, but this is not a requirement.

Like the process in FIG. 38 to FIG. 42, the process in FIG. 46 to FIG. 51 has the advantage of requiring only a single diffusion (or implantation) step. It also produces a diode that is structurally different from the diode in FIG. 43 to FIG. 44, in that the shallow part 48 is formed by etching the surface of the diode, rather than by controlling the diffusion depth. Since diffusion is performed under the same conditions over the entire area of the doped region 22, pn junction properties such as impurity concentration can be made uniform over the entire junction area.

Next the invented solutions to the problem of non-uniform sensitivity will be described.

Figure 52:
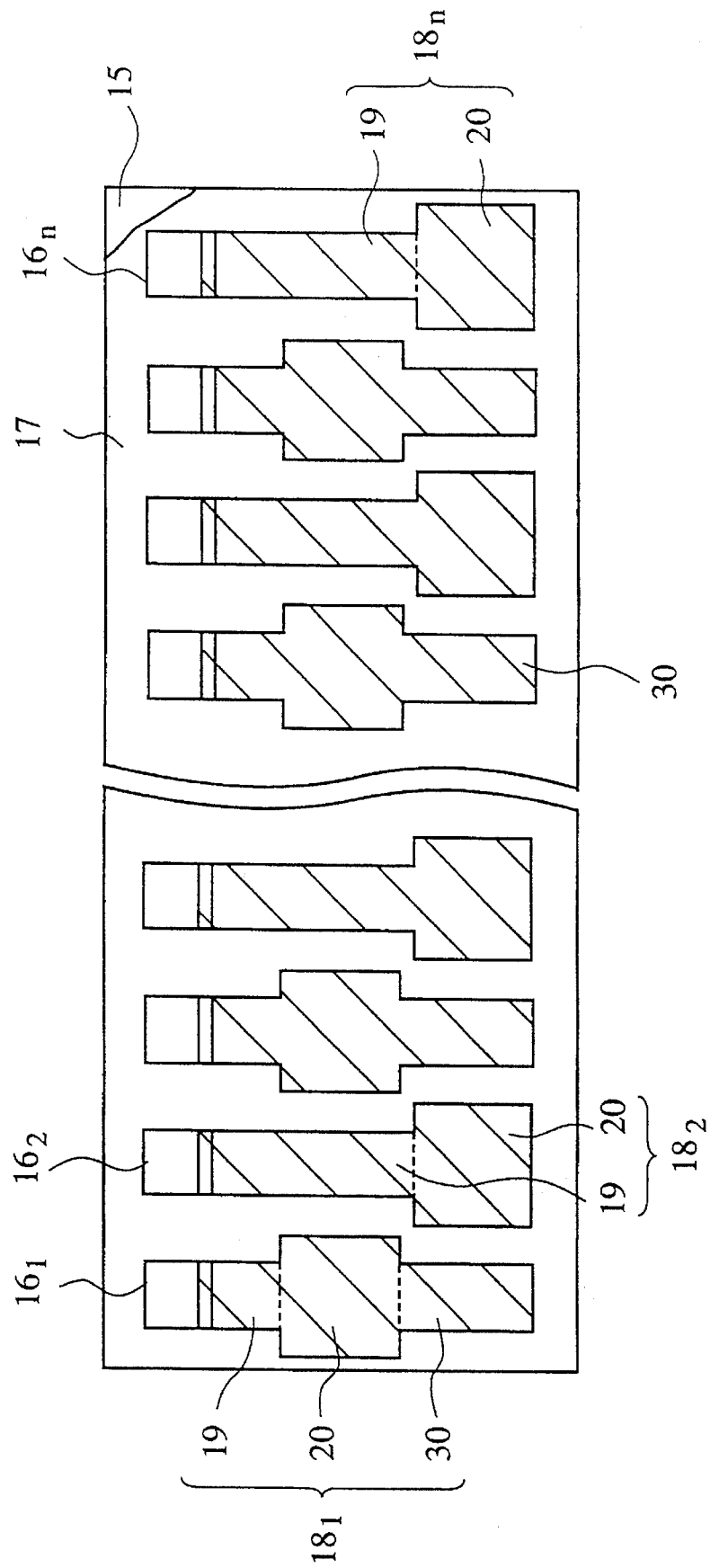
FIG. 52 is a plan view of a ninth embodiment of the invention.

FIG. 52 illustrates a ninth embodiment of the invention, directed toward the problem of non-uniform sensitivity. The same reference numerals are used as in FIG. 2, with subscripts from 1 to n identifying the diodes 16 and their conductive patterns 18.

This embodiment differs from FIG. 2 in that the conductive patterns 18 all have the same area. The odd-numbered conductive patterns $18_1$, $18_3$ . . . have extra tails 30 to make their area equal to the area of the even-numbered conductive patterns $18_2$, $18_4$ . . . The area of the tails 30 is equal to the difference in area between the leads 19 in the odd-numbered conductive pattern $18_1$, $18_3$ . . . and the leads 19 in the even-numbered conductive pattern $18_2$, $18_4$ . . . The bonding pacts 20 all have the same dimensions.

Other factors being equal, equal area implies equal parasitic capacitance: the parasitic capacitances formed by the semiconductor substrate 15, the insulating film 17, and the conductive patterns $18_1$, . . . $18_n$ are all substantially the same. A major cause of non-uniform sensitivity is thereby removed.

The conductive patterns $18_1$, . . . $18_n$ in FIG. 52 may be made of the conventional aluminum material, or other suitable materials. The diodes 16 may comprise pn junctions formed as described above, but the same arrangement of conductive patterns 18 can of course be used with other types of diodes, such as pin diodes. Moreover, this arrangement of conductive patterns is applicable to arrays of light-sensing diodes, as well as to arrays of light-emitting and light-sensing diodes.

Figure 53:
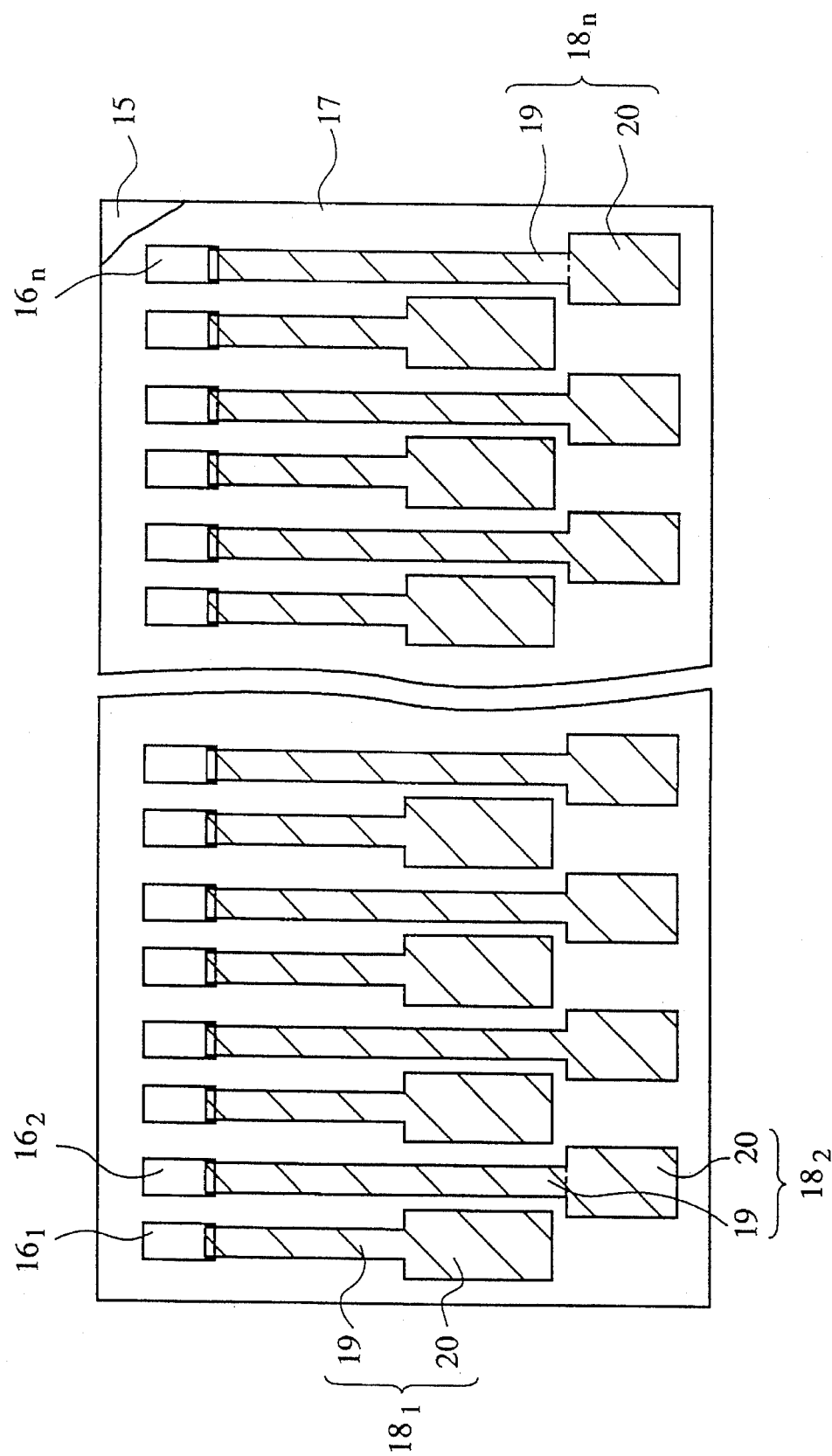
FIG. 53 is a plan view of a tenth embodiment of the invention.

FIG. 53 shows a tenth embodiment of the invention. This time the areas of the conductive patterns 18 have been equalized by adjusting the sizes of the bonding pads 20. The odd-numbered conductive patterns $18_1$, $18_3$, . . . which have shorter leads 19, have larger bonding pads 20, and the even-numbered conductive patterns $18_2$, $18_4$, . . . which have longer leads 19, have smaller bonding pads 20. The sizes of the bonding pads 20 can be adjusted by varying their length, width, or shape.

Figure 54:
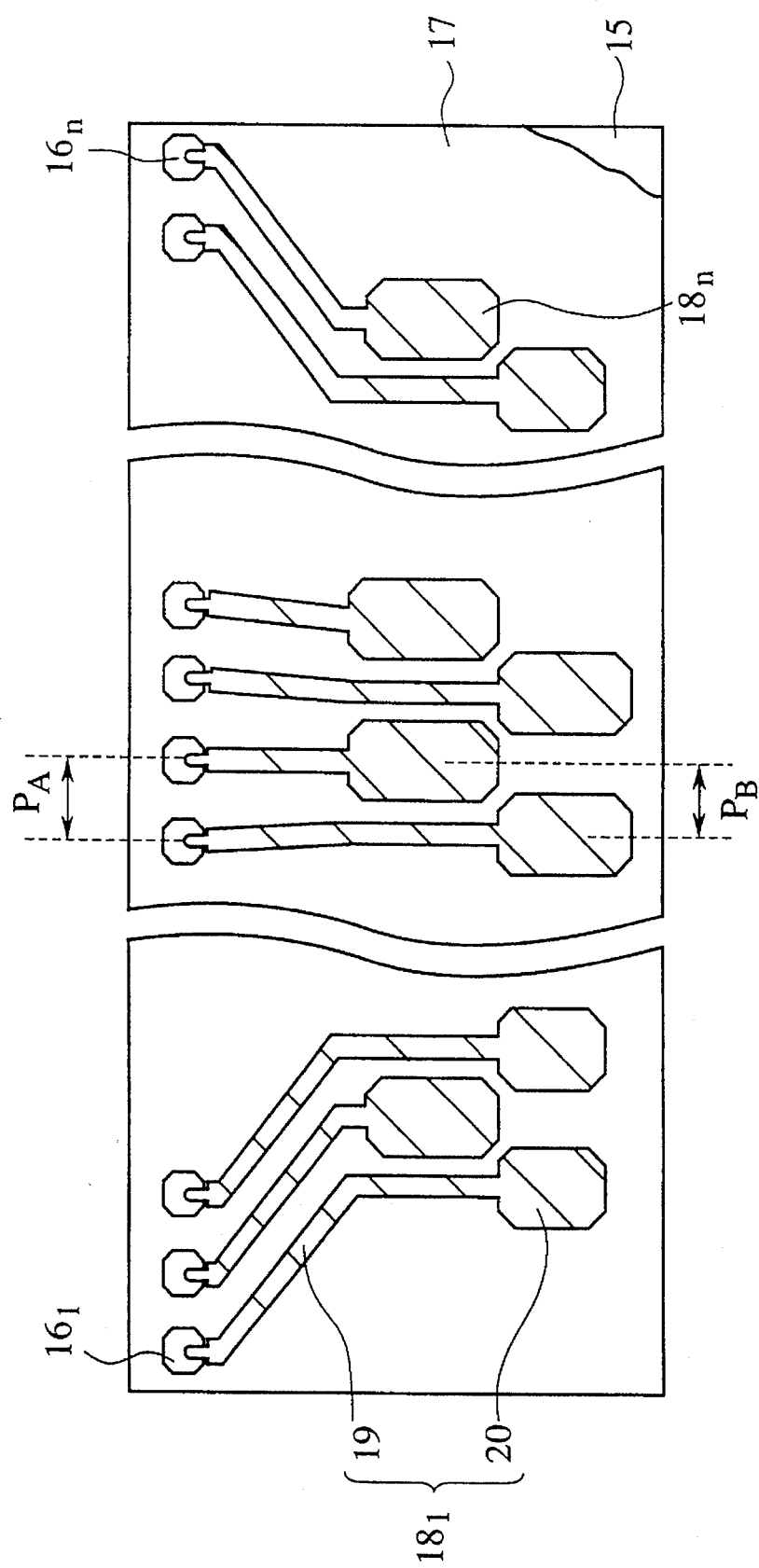
FIG. 54 is a plan view of a eleventh embodiment of the invention.

FIG. 54 shows all eleventh embodiment of the invention, in which the pitch $P_A$ of the diodes 16 exceeds the pitch $P_B$ of the bonding pads 20. This arrangement is commonly used to permit the diode-array chips to be placed end-to-end, while leaving spaces between their driver chips. Here the length of the leads 19 varies not only between even- and odd-numbered conductive patterns 18, but also between conductive patterns 18 disposed near the ends of the array and conductive patterns 18 disposed near the center. Again, the size of the bonding pads 20 is adjusted to compensate for these differences, so that all conductive patterns $18_1$ . . . $18_n$ have the same area.

Even if the areas of the conductive patterns 18 are equalized, the sensitivity of the diodes pn the array may still vary for other reasons, such as variations in the thickness of the insulating film 17, and variations in the areas of the pn junctions as noted earlier. These remaining differences can be compensated for by trimming the conductive patterns 18 after they have been formed, as in the twelfth embodiment of the invention described next.

Figure 55:
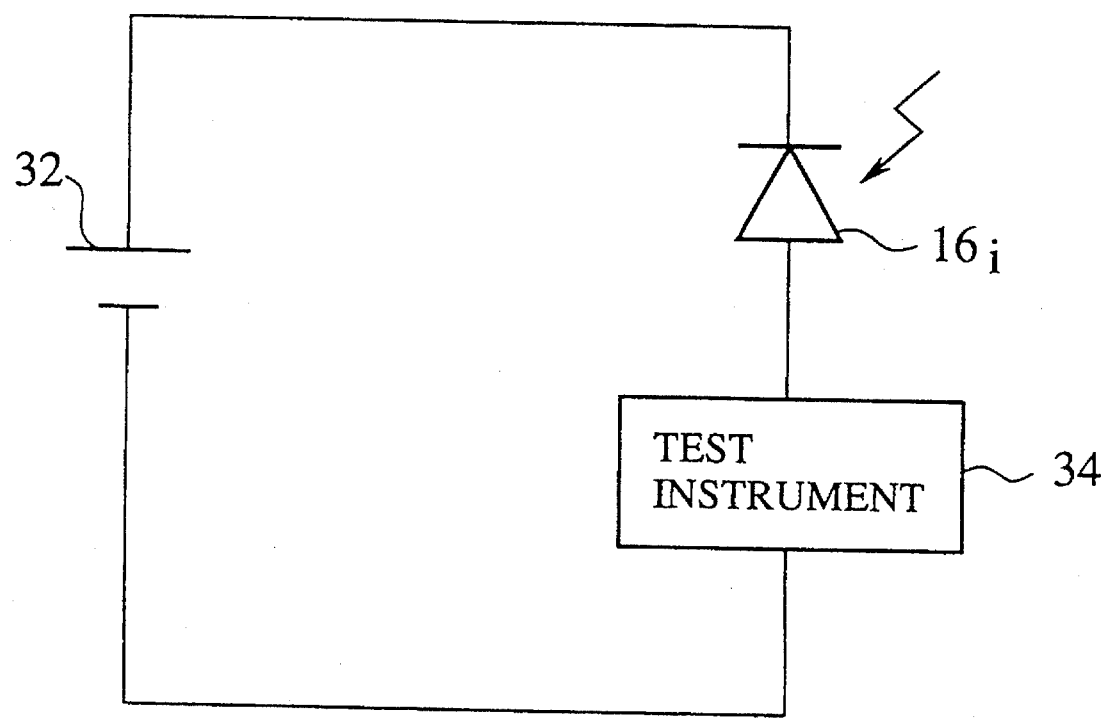
FIG. 55 is a schematic diagram of a system for measuring the resistance and capacitance of a diode.

FIG. 55 is a schematic diagram of a measurement system for use in trimming. A bias power supply 32 is connected to an individual diode $16_i$ in the array 2 so as to reverse-bias the diode $16_i$. For example, a voltage E of 5 V is supplied to the metalized film 24 in FIG. 3, while the conductive pattern 18 of the diode $16_i$ is coupled through a test instrument 34 to ground. The test instrument 34 capable of measuring current flow and capacitance is connected in series with the diode $16_i$.

Two measurements are performed on the diode $16_i$. One measures the capacitance $C_i$. The other measures the photocurrent $I_i$ when the diode $16_i$ is illuminated by visible light. The resistance $R_i$ and RC time constant $T_i$ of the diode $16_i$ are then calculated from the equations:

$$R_i = E/I_i$$

$$T_i = R_i C_i$$

These measurements are carried out on each diode $16_i$ in the array, using the same illumination level for all diodes, and the minimum time constant $T_{min}$ is found. Then a new desired capacitance $X_i$ is calculated for each diode $16_i$ by the formula:

$$X_i = T_{min}/R_i$$

Figure 56:
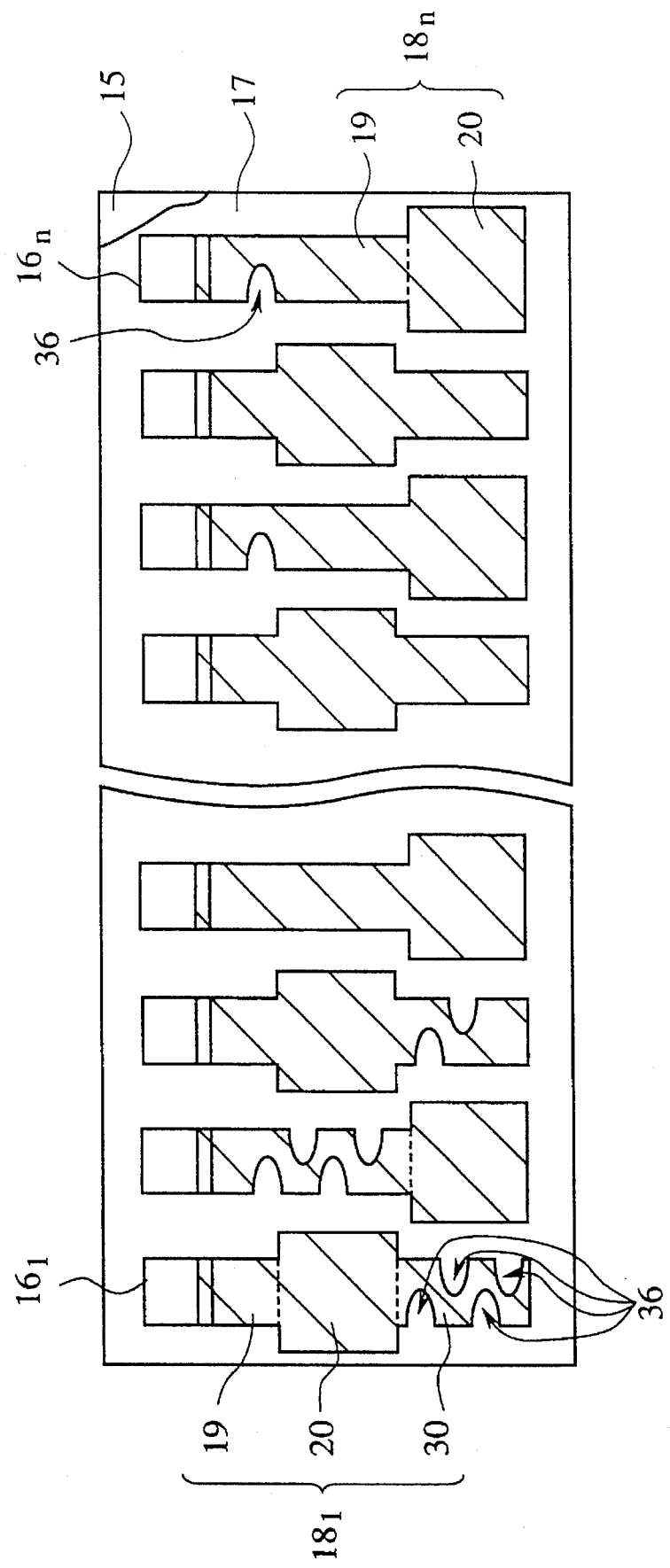
FIG. 56 is a plan view of a twelfth embodiment of the invention.

Referring to FIG. 56, the conductive pattern $18_i$ of each diode is trimmed by cutting notches 36 so as to adjust the capacitance of the diode as closely as possible to the desired value $X_i$. The notches 36 can be cut by well-known laser trimming methods employing, for example, a carbon dioxide gas laser. As a result, for the above fixed level of illumination, every diode in the array now has substantially the same RC time constant $T_{min}$. From the equation (1) given earlier, it follows that every diode has substantially the same sensitivity.

To take a concrete example, suppose that the measured current and capacitance values of the first diode are $I_1=50$ nA and $C_1=15$ nF. If the applied voltage E is 5 V, then $R_1=100$ MΩ. If the minimum RC time constant $T_{min}$ is 1 ΩF, then $X_1=10$ nF. By comparing the actual capacitance $C_1$ of 15 nF with the desired capacitance $X_1$ of 10 nF, the number of notches to cut in the conductive pattern $18_1$ can be determined.

FIG. 56 shows the result of trimming the novel diode array in FIG. 52, but the same trimming scheme can of course be applied to the novel array in FIG. 53 or FIG. 54, or even to the conventional array in FIG. 2.

The inventive concepts described in connection with the ninth to twelfth embodiments can be applied in combination with the inventive concepts described in connection with the first to eighth embodiments.

The present invention is not restricted to the shapes, dimensions, positional relationships, and materials described above. Those skilled in the art will recognize that many further modifications can be made without departing from the scope of the invention claimed below.

What is claimed is:

1. A diode for emitting and sensing light, comprising:
   an n-type gallium-arsenide-phosphide semiconductor substrate; and
   a p-type doped region disposed in said substrate, having a depth of at least 0.3 micrometers but not more than two micrometer in said substrate, containing p-type impurity atoms at a concentration of at least $5 \times 10^{20}$ impurity atoms per cubic centimeter but not more than $10^{23}$ impurity atoms per cubic centimeter.

2. The diode of claim 1, wherein said impurity atoms are zinc atoms.

3. The diode of claim 1, wherein said substrate comprises $GaAs_{0.8}P_{0.2}$.

4. A diode array device comprising an array of diodes each as set forth in claim 1, wherein the semiconductor substrates of all the diodes are common with each other.

5. A diode for emitting and sensing light, comprising:
   a semiconductor substrate having a layer of n-type gallium-arsenide-phosphide; and
   a p-type doped region formed by introducing an impurity into said layer of n-type gallium-arsenide-phosphide from part of one surface of said semiconductor substrate, so that a pn junction is created at an interface between said p-type doped region and said semiconductor substrate;

wherein:
   as seen from said one surface, said p-type doped region comprises a deep part in which said pn junction has a first depth, and a shallow part in which said pn junction has a second depth less than said first depth; and
   light is emitted primarily from said deep part and sensed primarily in said shallow part.

6. The diode of claim 5, wherein said shallow part surrounds said deep part.

7. The diode of claim 5, wherein said deep part and said shallow part are disposed side-by-side.

8. The diode of claim 5, wherein said diode emits near-infrared light and senses visible light.

9. A diode array device comprising an array of diodes each as set forth in claim 5, wherein the semiconductor substrates of all the diodes are common with each other.

10. The diode of claim 5, further comprising a conductive pattern formed on said one surface of said semiconductor substrate, making electrical contact with said p-type doped region, but covering less than one-half of said deep part and less than one-half of said shallow part.

* * * * *